(12) United States Patent
Thompson et al.

(10) Patent No.: US 7,834,808 B2
(45) Date of Patent: Nov. 16, 2010

(54) MULTILAYER ELECTRONIC COMPONENT SYSTEMS AND METHODS OF MANUFACTURE

(75) Inventors: Dane Thompson, Atlanta, GA (US);
Guoan Wang, Atlanta, GA (US);
Nickolas D. Kingsley, Atlanta, GA (US);
Ioannis Papapolymerou, Decatur, GA (US); Emmanouil M. Tentzeris, Atlanta, GA (US); Ramanan Bairavasubramanian, Atlanta, GA (US); Gerald DeJean, Atlanta, GA (US); RongLin Li, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 431 days.

(21) Appl. No.: 11/993,890

(22) PCT Filed: Nov. 23, 2005

(86) PCT No.: PCT/US2005/042749

§ 371 (c)(1),
(2), (4) Date: Dec. 26, 2007

(87) PCT Pub. No.: WO2008/030208

PCT Pub. Date: Mar. 13, 2008

(65) Prior Publication Data

US 2010/0090902 A1    Apr. 15, 2010

Related U.S. Application Data

(60) Provisional application No. 60/694,959, filed on Jun. 29, 2005.

(51) Int. Cl.
*H01Q 1/38* (2006.01)
(52) U.S. Cl. .................. 343/700 MS; 29/600
(58) Field of Classification Search .......... 343/700 MS, 343/853; 29/600
See application file for complete search history.

(56) References Cited

U.S. PATENT DOCUMENTS 5,554,995 A * 9/1996 Jun ................. 343/700 MS
6,133,878 A * 10/2000 Lee ................. 343/700 MS (Continued)

OTHER PUBLICATIONS

International Search Report mailed Jul. 17, 2008 in related application No. PCT/US05/42749.

*Primary Examiner*—HoangAnh T Le
(74) *Attorney, Agent, or Firm*—Thomas, Kayden, Horstemeyer & Risley, LLP

(57) ABSTRACT

Multilayer electronic component systems and methods of manufacture are provided. In this regard, an exemplary system comprises a first layer of liquid crystal polymer (LCP), first electronic components supported by the first layer, and a second layer of LCP. The first layer is attached to the second layer by thermal bonds. Additionally, at least a portion of the first electronic components are located between the first layer and the second layer.

19 Claims, 30 Drawing Sheets

U.S. PATENT DOCUMENTS

| | | |
|---|---|---|
| 6,677,899 B1 | 1/2004 | Lee et al. |
| 7,102,571 B2 * | 9/2006 | McCarrick ........... 343/700 MS |
| 2002/0014992 A1 | 2/2002 | Sun et al. |
| 2002/0089456 A1 | 7/2002 | Hamada |
| 2003/0189516 A1 | 10/2003 | Olson |
| 2003/0201937 A1 * | 10/2003 | Lee ..................... 343/700 MS |
| 2004/0196190 A1 | 10/2004 | Mendolia et al. |
| 2004/0201526 A1 | 10/2004 | Knowles et al. |
| 2005/0099358 A1 | 5/2005 | McCarrick |

* cited by examiner

RETURN LOSS CHARACTERISTICS OF THE 14 GHz ARRAY

| Characteristic | Simulated 14-135 | Measured 14-135 |
|---|---|---|
| Resonant Frequency | 14 GHz | 13.72 GHz |
| Return Loss | -30.7 dB | -16.5 dB |
| -10 dB Return Loss Bandwidth | 140 MHz | 160 MHz |
| Percent Bandwidth | 1.00% | 1.17% |

RETURN LOSS CHARACTERISTICS OF THE 35 GHz ARRAY

| Characteristic | Simulated 35-135 | Measured 35-135 |
|---|---|---|
| Resonant Frequency | 34.87 GHz | 34.32 GHz |
| Return Loss | -32.5 dB | -39.6 dB |
| -10 dB Return Loss Bandwidth | 1560 MHz | 1530 MHz |
| Percent Bandwidth | 4.47% | 4.46% |

RADIATION PATTERN CHARACTERISTICS OF THE 14 GHz ARRAY

| Characteristic | Simulated 14-135 | Measured 14-135 |
|---|---|---|
| E-Plane -3 dB Beamwidth | 65° | 67° |
| H-Plane -3 dB Beamwidth | 58° | 58° |
| Max. Cross-pol.(E-plane) | -31 dB | -25 dB |
| Max. Cross-pol.(H-plane) | -33 dB | -30 dB |

RADIATION PATTERN CHARACTERISTICS OF THE 35 GHz ARRAY

| Characteristic | Simulated 35-135 | Measured 35-135 |
|---|---|---|
| E-Plane -3 dB Beamwidth | 65° | 66° |
| H-Plane -3 dB Beamwidth | 59° | 59° |
| Max. Cross-pol.(E-plane) | -15 dB | -14 dB |
| Max. Cross-pol.(H-plane) | -16 dB | -15 dB |

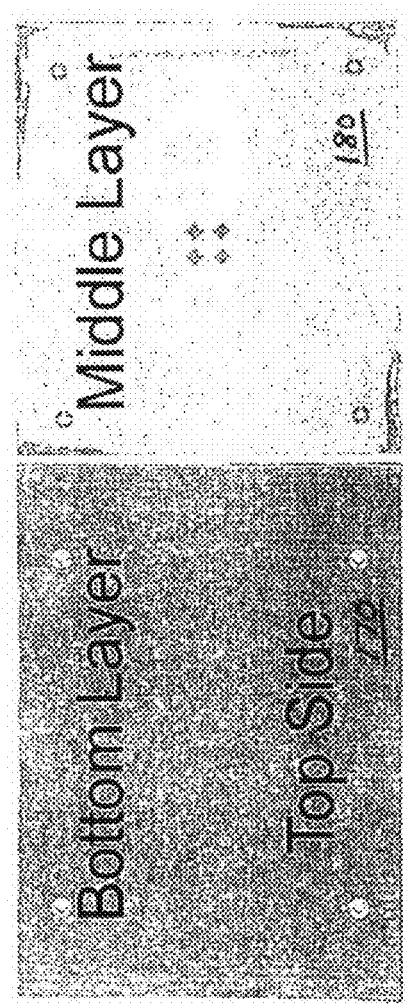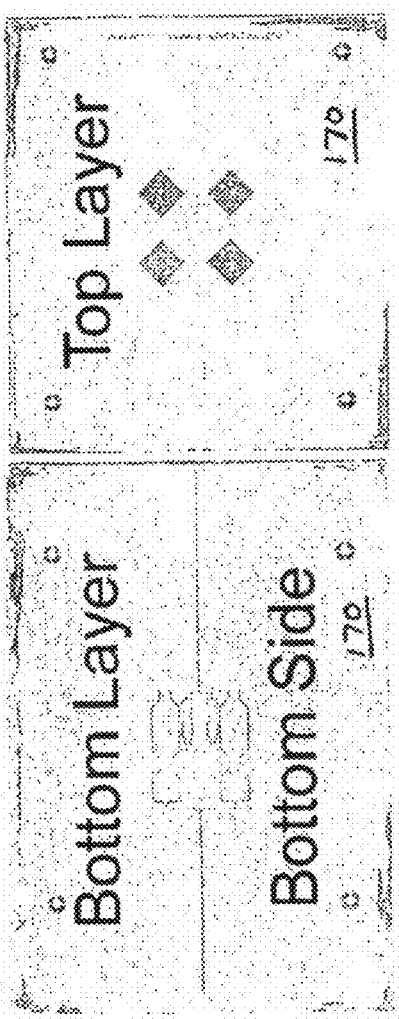
FIG. 19A  FIG. 19B  FIG. 19C  FIG. 19D
Individual Layers (Before Bonding)

Return Loss of the 14 GHz Array

| Attribute | Simulated | Measured |
|---|---|---|
| Resonant Frequency | 14 GHz | 14.1 GHz |
| Return Loss | -30 dB | -45 dB |
| Bandwidth | 280 MHz | 255 MHz |
| %Bandwidth | 2% | 1.8% |

Return Loss of the 35 GHz Array

| Attribute | Simulated | Measured |
|---|---|---|
| Resonant Frequency | 35 GHz | 34.3 GHz |
| Return Loss | -32 dB | -21 dB |
| Bandwidth | 725 MHz | --- |
| %Bandwidth | 2.1% | --- |

E-Plane Patterns

| Characteristic | Simulated | Measured |
|---|---|---|
| 3dB Beamwidth | 52° | 54° |
| Cross-Pol level | -18 dB | -14 dB |

*Average Cross Pol ~ -18 dB*

H-Plane Patterns

| Characteristic | Simulated | Measured |
|---|---|---|
| 3dB Beamwidth | 51° | 49° |
| Cross-Pol level | -18 dB | -14 dB |

*Average Cross Pol ~ -18 dB*

MULTILAYER ELECTRONIC COMPONENT SYSTEMS AND METHODS OF MANUFACTURE

CROSS-REFERENCE TO RELATED APPLICATIONS

This application is based on and claims priority to U.S. Provisional Patent Application Ser. No. 60/694,959, filed on Jun. 29, 2005, which is incorporated by reference herein.

STATEMENT REGARDING FEDERALLY SPONSORED RESEARCH

The U.S. government may (or does) have a paid-up license in this invention(s) and the right in limited circumstances to require the patent owner to license others on reasonable terms as provided for by the terms of NASA contract NCC3-1057.

BACKGROUND

Many radar and communication systems need antennas with dual-polarization and dual-frequency capabilities for higher capacity data transfer. Microstrip patch antennas are often desirable antenna elements in such applications due to their low cost, low profile, light weight, and ease of fabrication characteristics. In recent years, there has been much research done in the field of designing dual-frequency and dual-polarization microstrip antenna arrays.

When designing dual-frequency, dual-polarized microstrip antenna arrays, many parameters of interest and the associated complexity both in design and fabrication are confronted. For instance, a complex feeding structure typically is required for reducing interconnect loss, feedline radiation, and cross-coupling. Substrate thickness can affect cross-polarization levels as well as bandwidth and efficiency. The distance of the antenna elements in the array can affect−3-dB beam width, directivity, and side-lobe levels besides impacting the overall size. Careful consideration needs to be given to avoid cross-coupling between the antenna arrays operating at different frequencies, blockage effects, and edge diffraction. Based on these and/or other considerations, it is challenging to achieve the aforementioned performance with a single layer structure.

In this regard, multilayer architectures have been considered. One such design of a dual-frequency, dual-polarized microstrip antenna array incorporating vertical integration was proposed by Granholm and Skou. This design incorporates C-band and L-band patches operating at 1.25 and 5.3 GHz, respectively. The C-band and L-band patches are located on metal layers separated by substrate layers of three distinct dielectric media, including foam.

Although there have been many reported examples of dual-frequency, dual-polarization microstrip antenna arrays on substrates, such as DUROID™, these designs are not always favorable for a radio frequency (RF) system-on-a-package (SOP) low-cost technology due to various undesirable substrate properties. Materials, like DUROID™, are often used in conjunction with low dielectric constant foam to realize multilayer configurations. Such composite multilayer structures are potentially subjected to greater stress due to coefficient of thermal expansion (CTE) mismatches, which can alter the dimensions of the structure.

Although low temperature co-fired ceramic (LTCC) technology is suitable for multilayer realizations of microwave circuits such as filters and other passives, LTCC technology is not ideal for antenna implementations. This is because antennas using high index materials such as LTCC typically result in pronounced surface wave excitation that can limit the impedance bandwidth, reduce the efficiency, and degrade the radiation pattern. One solution is to use micro-machined or suspended patch antennas albeit with increased fabrication cost and complexity. Another alternative is to use a hybrid integration scheme wherein different dielectric media can be integrated to control the effective index. However, such multilayer structures formed by integrating different materials tend to be subjected to greater stresses due to coefficient of temperature expansion (CTE) mismatches.

SUMMARY

Multilayer electronic component systems and methods of manufacture are provided. In this regard, an exemplary embodiment of such a system comprises a first layer of liquid crystal polymer (LCP), first electronic components supported by the first layer, and a second layer of LCP. The first layer is attached to the second layer by thermal bonds. Additionally, at least a portion of the first electronic components are located between the first layer and the second layer.

Another embodiment of such a system comprises: a first layer of liquid crystal polymer (LCP); a first antenna array supported by the first layer; a second layer of LCP fixed with respect to the first layer; and a second antenna array supported by the second layer. The first antenna array and the second antenna array operate at different GHz frequencies.

An embodiment of a method for manufacturing a multilayer electronic component system comprises: providing a first layer of liquid crystal polymer (LCP); supporting first electronic components with the first layer; and thermally bonding a second layer of LCP to the first layer such that the first electronic components are located between at least a portion of the first layer and at least a portion of the second layer.

BRIEF DESCRIPTION OF THE DRAWINGS

In the drawings, like reference numerals indicate corresponding components. Additionally, the drawings are not necessarily to scale.

FIGS. 19A-19D are various views of the layers used to form the embodiment shown in FIG. 16A.

DETAILED DESCRIPTION

As will be described in detail here, multilayer electronic component systems and methods of manufacture are provided. In particular, such systems and methods involve the use of liquid crystal polymer (LCP). LCP exhibits a low dielectric constant and low loss tangent in tandem with low water absorption coefficient and low cost. Additionally, the coefficient of thermal expansion (CTE) of LCP can be adjusted, such as through thermal treatments, facilitating integration of integrated circuits in system-on-a-package (SOP) modules, for example.

In some embodiments, multilayer electronic component systems can be configured as antenna arrays. Since LCP is a flexible material, some such embodiments can be formed of sheets of LCP that can be flexed, rolled up, and easily deployed, such as would be useful for outer space applications.

With respect to embodiments configured as antenna arrays, an embodiment of a dual-frequency (14 and 35 GHz) microstrip antenna array with dual-polarization capabilities excited separately at each frequency on flexible LCP multilayer substrates will be described. Such a design can be applied, for example, to the remote sensing of precipitation at 14 and 35 GHz, respectively. Additionally, such an embodiment can be extended by integrating RF microelectromechanical systems (MEMS) switches with the antenna array to switch polarizations. Thus, such an embodiment can exhibit a low-power reconfigurable antenna array design. Full-wave simulations of the antenna array will also be described that validate, with good agreement, the measured results of scattering parameters and radiation patterns.

Figure 1:
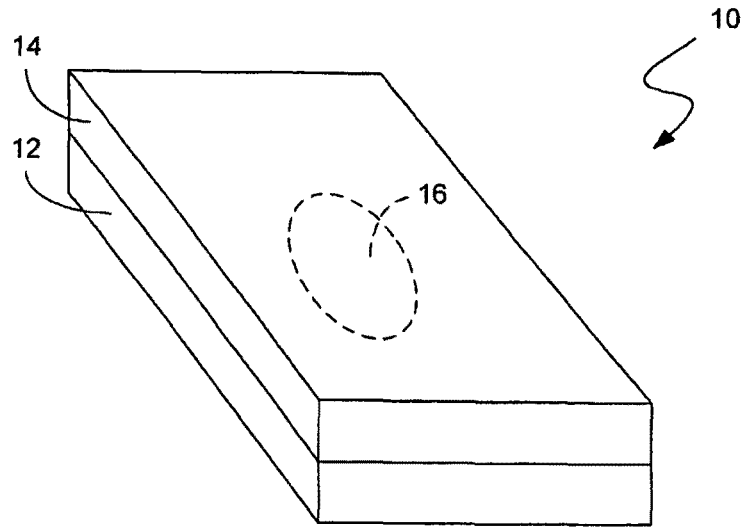
FIG. 1 is a schematic diagram of an embodiment of a multilayer electronic component system.

With reference to the drawings, FIG. 1 schematically depicts an embodiment of a multilayer electronic component system 10. In particular, system 10 incorporates a first layer 12 and a second layer 14, both formed of LCP. The first layer and the second layer are fixed in position with respect to each other. In this embodiment, the first and second layers are thermally bonded to each other.

The first layer 12 supports electronic components 16. Specifically, the electronic components are located between at least a portion of the first layer 12 and at least a portion of the second layer 14. The electronic components 16 in this embodiment are MEMS devices, although, in other embodiments, various other types of components (such as transistors, among others) can be used. Communication with and/or among the electronic components can be facilitated by various interconnect arrangements, such as vias, although such structures are not depicted in FIG. 1.

Figure 2:
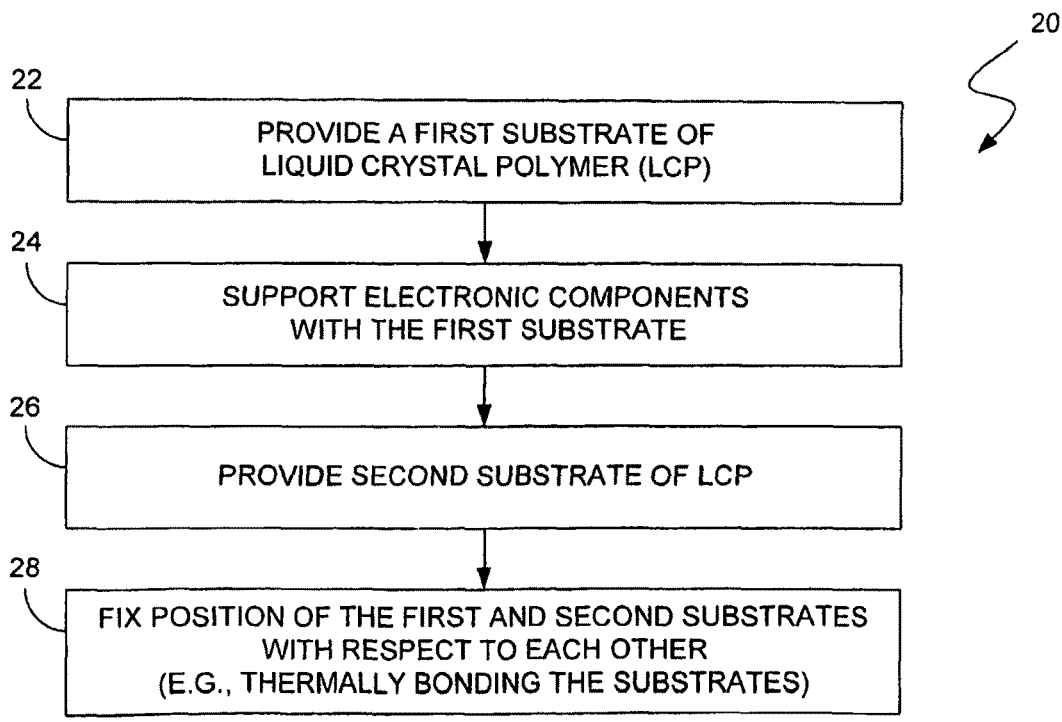
FIG. 2 is a flowchart of an embodiment of a method of manufacturing a multilayer electronic component system.

An embodiment of a method of manufacturing a multilayer electronic component system is depicted in the flowchart of FIG. 2. As shown in FIG. 2, the method 20 may be construed as beginning at block 22, in which a first substrate of LCP is provided. In block 24, electronic components are arranged to be supported by the first substrate. In block 26, a second substrate of LCP is provided. Then, in block 28, the first and second substrates are fixed in position with respect to each other to to form a multilayer electronic component system. In some embodiments, the first and second substrates are fixed in position with respect to each other, such as by thermal bonding. In some of these embodiments, the thermal bonds are formed directly between material of the first and second substrates. In other embodiments, another material can be placed between the first and second layers to facilitate bonding, such as another layer of LCP or adhesive, for example.

Figure 3:
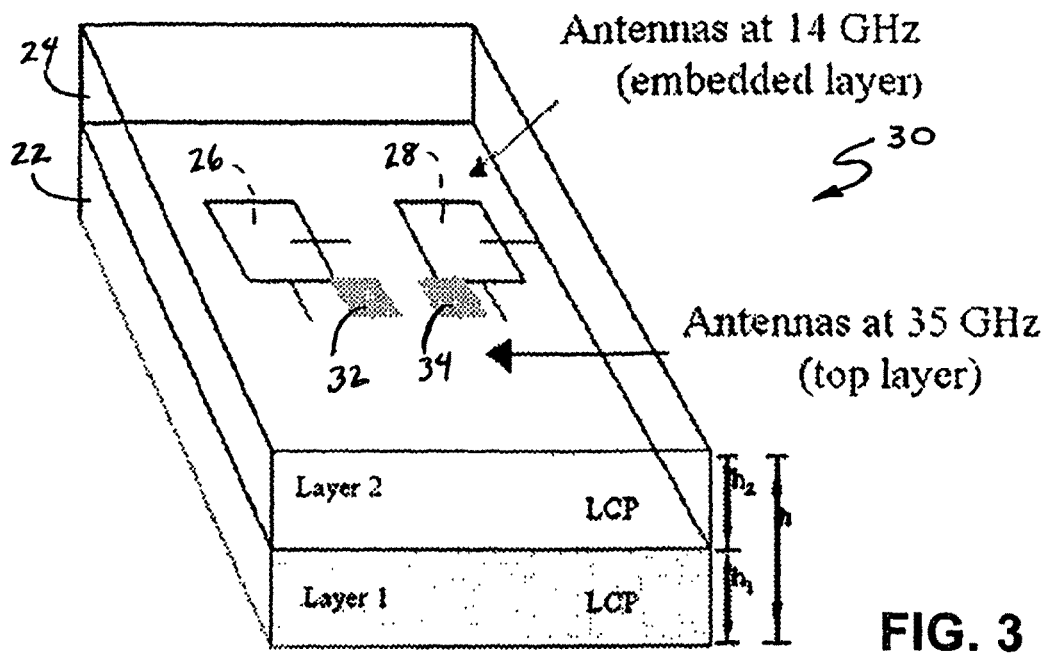
FIG. 3 is another embodiment of a multilayer electronic component system.
Figure 4:
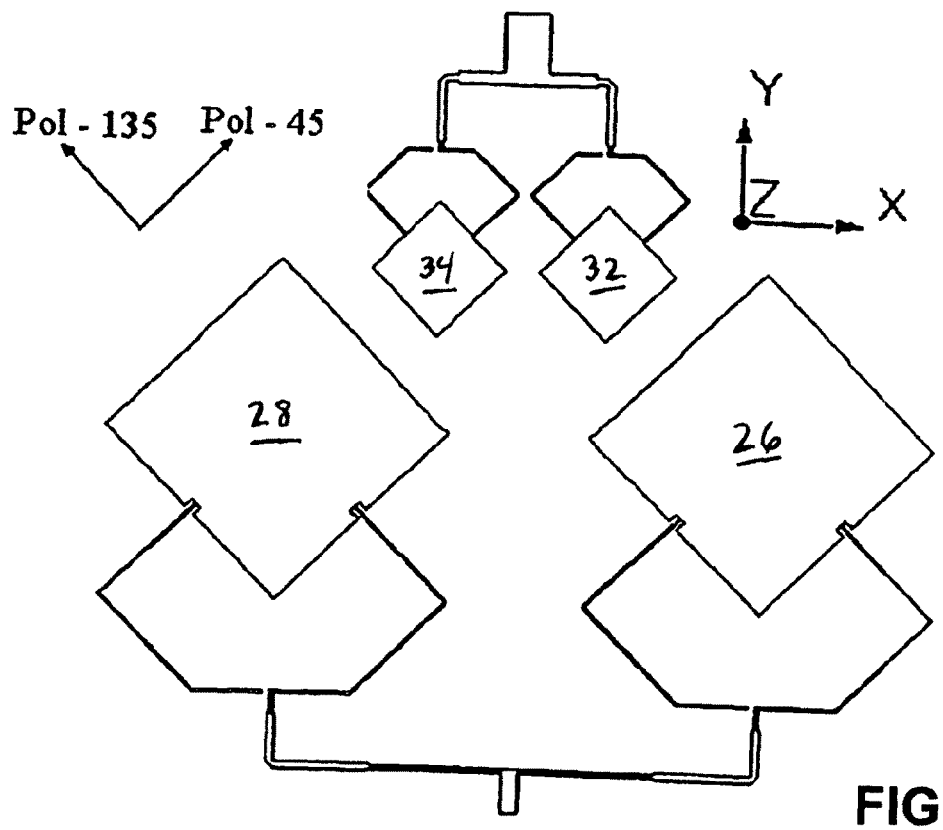
FIG. 4 is a schematic diagram depicting detail of the embodiment of FIG. 3.

Another embodiment of a multilayer electronic component system is depicted schematically in FIGS. 3 and 4. In this embodiment, the system is configured as a dual-polarization, dual-frequency microstrip antenna array that operates at frequencies of approximately 14 and approximately 35 GHz, respectively. Specifically, system 30 of FIG. 3 incorporates a first substrate 22 and a second substrate 24, both comprising LCP. Substrate 22 supports electronic components for the 14 GHz antennas, and substrate 24 supports electronic components for the 35 GHz antennas. In particular, and as best shown in FIG. 4, substrate 22 supports antenna patches 26 and 28, as well as antenna feeds 30, and substrate 24 supports antenna patches 32 and 34, as well as antenna feeds 36.

In this embodiment, total substrate thickness h is 17 mils, i.e., two LCP substrates (each 8 mils thick) and a 1-mil bonding layer (not shown). The 14-GHz antenna array is located on the substrate 22. In contrast, the 35-GHz patches (32 and 34), which are physically smaller than the 14-GHz patches, are located on the substrate 24. This arrangement (at the interface of LCP and air) tends to reduce blockage of the 14-GHz radiation. The particular choice of substrate thicknesses stemmed from analysis of their influence on cross-polarization levels, bandwidth, and efficiency at each frequency. The feed network for each array was placed in the same layer as the antenna patches. This configuration was chosen ahead of many other configurations, including aperture-coupled and proximity-coupled feeding, to reduce computational and fabrication complexity. However, in other embodiments, types of feed networks other than that depicted can be used.

As shown in FIG. 4, the patches of the dual-frequency antenna array of this embodiment are oriented in a diagonal relationship. This particular design is intended for precipitation radar systems, for example, wherein similar characteristics for orthogonal polarizations and polarization purity are important, no matter what frequency band is used. As shown in the figure, the patches are rotated by 45° and the polarization directions are at 45° and 135° as opposed to the traditional x-y directions. This arrangement helps in realizing a symmetrical feed network for both polarizations with similar impedance and radiation pattern characteristics.

As a first modeling step, the switching of polarizations is controlled by the presence of "hard-wired" perfect "short" and "open" conditions. In a practical implementation, RF MEMS switches can be used to switch polarizations and steer the main beam. To simplify the antenna structure, the design approach uses an unloaded 200 µm gap to simulate an "OFF" state and a continuous feedline to simulate an "ON" state. In order to reduce the radiation effects of the feed lines, the lines that directly connect to the patches are thin. A recessed patch feed and a combination of T-junctions and quarter-wave transformers (not shown) are employed to achieve better matching, and a symmetric feed structure is used to expand into a 2×1 array. EmPicasso™, a MOM (method-of-moments) based frequency domain full-wave solver, was used for design and simulations.

Based on the design shown in FIGS. 3 and 4, a physical implementation was constructed. In particular, the antenna arrays were fabricated with two copper-clad 8-mil LCP dielectric sheets and one 1-mil LCP adhesion layer from Rogers Corporation. Although a thick copper layer may restrict the minimum feature size due to undercut problems, it is difficult to sputter/electroplate thin layers of copper on LCP reliably because it has a low stiction coefficient to copper. Therefore, thick copper cladding is used and the etch process was characterized and the patterns are modified beforehand to compensate for the undercut. The overetch is approximately 13 µm for 18 µm-thick copper layer and is significant compared to the width of the thin feedlines (50 µm) that are connected to the patches. Besides it can alter critical dimensions of the array, such as the patch length and width. This can cause undesirable shifts in the resonant frequency of the array especially at 35 GHz.

An alternative to using thick copper would be to introduce a thin seed layer such as titanium between copper and LCP to improve stiction. Although this was not tried, a thin seed layer (0.3 µm) should have no effect on array performance because the copper layer (3 µm) will be much thicker in comparison. Such layers are often used in semiconductor circuits with no effect on performance.

Figure 5:
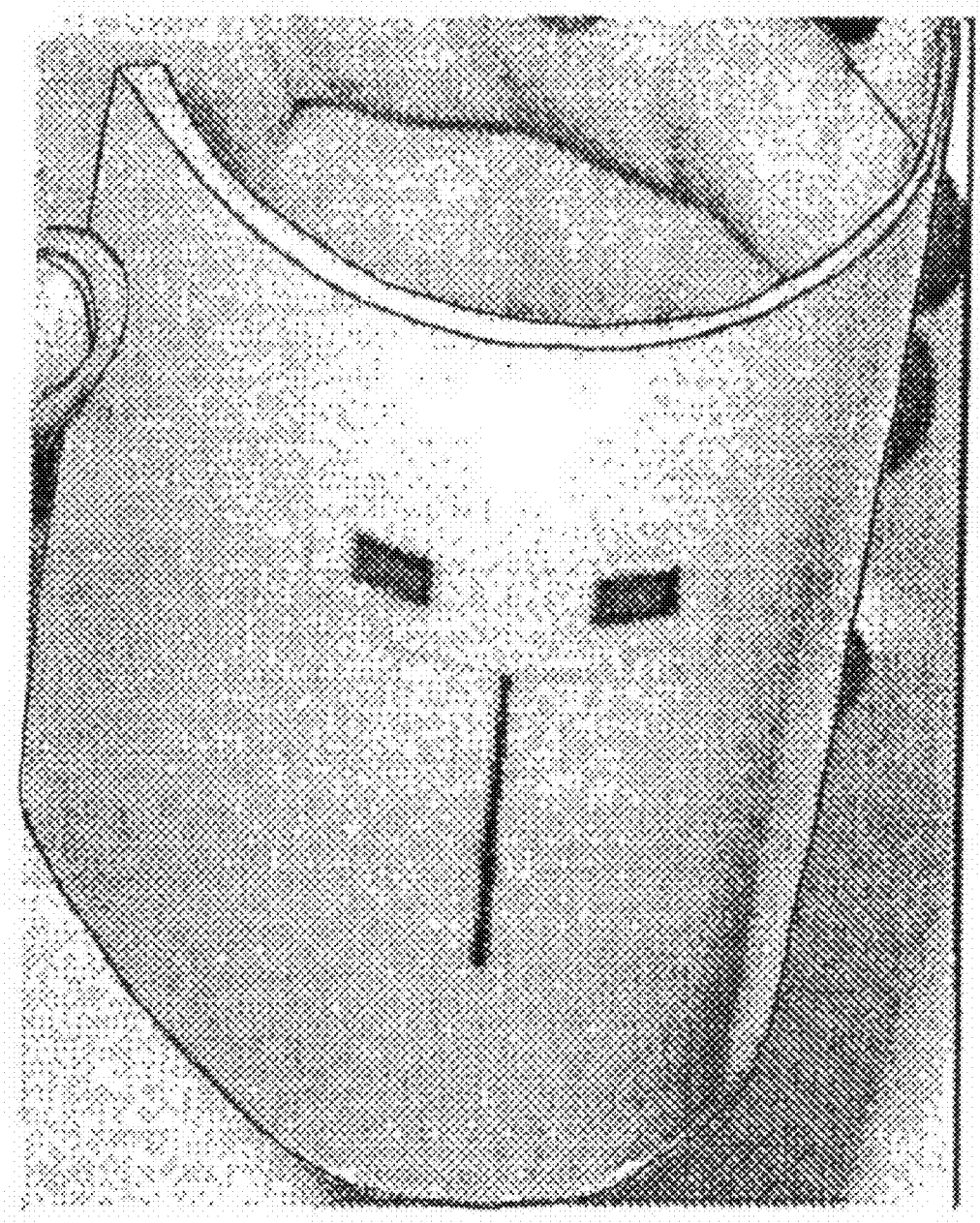
FIG. 5 is a perspective view of an embodiment of a multilayer electronic component system.

Shipley 1827 photoresist was used for pattern definition and the arrays are exposed under 16000-dpi mask transparencies pressed into sample contact with 5-in glass mask plates. Photoresist development and a wet chemical etch with ferric chloride were then performed to complete the antenna patterning. The LCP layers with the 14- and the 35-GHz arrays were then bonded together in a Karl Suss SB-6 silicon wafer bonder using a 1-mil low melt LCP bond layer sandwiched between the two 8-mil high melt LCP core layers. The bond layer melts at a lower temperature than the core layers and its flow coupled with the tool pressure applied between the core layers results in the realization of multilayer LCP structures. Since suitability of the resultant mutlilayer structure depends in large part on the quality of the bonding procedure, various tests should be performed to ensure that temperature and pressure settings, for example, for the bonding process are acceptable based on various factors such as material type and thickness, for example. In this case, several experiments were carried out to optimize the temperature and the tool pressure to achieve good bonding while reducing shrinkage, formation of bubbles, and melting of core layers. Notably, bubbles can result in air gaps that can affect the array performance at millimeter-wave frequencies. A perspective view of the embodiment of the antenna array constructed on LCP is shown in FIG. 5. As should be noted, the flexibility of the substrate may enable the arrays to be provided in various configurations, such as arrays that are configured to conform to curved surfaces, for example.

The array was mounted on an aluminum fixture that included a 2.4-mm coaxial-to-microstrip connector to measure the return loss of the array. A short-, open-, load-, and-thru-calibration was performed on a vector network analyzer with the reference planes at the end of the coaxial cables. When required, the microstrip launcher was adjusted to improve the antenna under test (AUT) to coaxial launcher impedance match. An anechoic chamber with the AUT as the receive element and a 15-dB gain horn antenna as the transmitting antenna was used for radiation pattern measurements. The AUT was rotated through the measurement plane, and the entire system, including the data recording, was automated. Because the microstrip launcher and the absorbing material placed around it covered a portion of the plane during the scan, there was a slight asymmetry in the radiation patterns due to the characterization system. In addition, the absorber affected the radiation pattern at scan angles greater than 70° off boresight.

Figure 6:
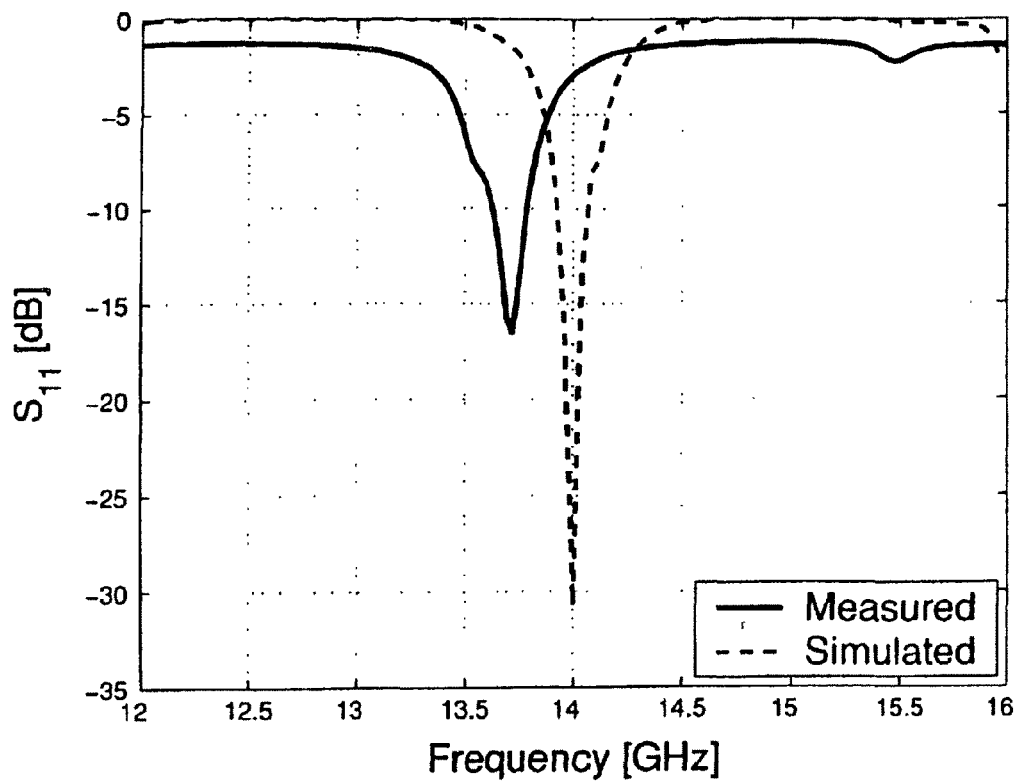
FIG. 6 is a chart depicting return loss of the 14 GHz array of the embodiment of FIGS. 3-4.
Figure 7:
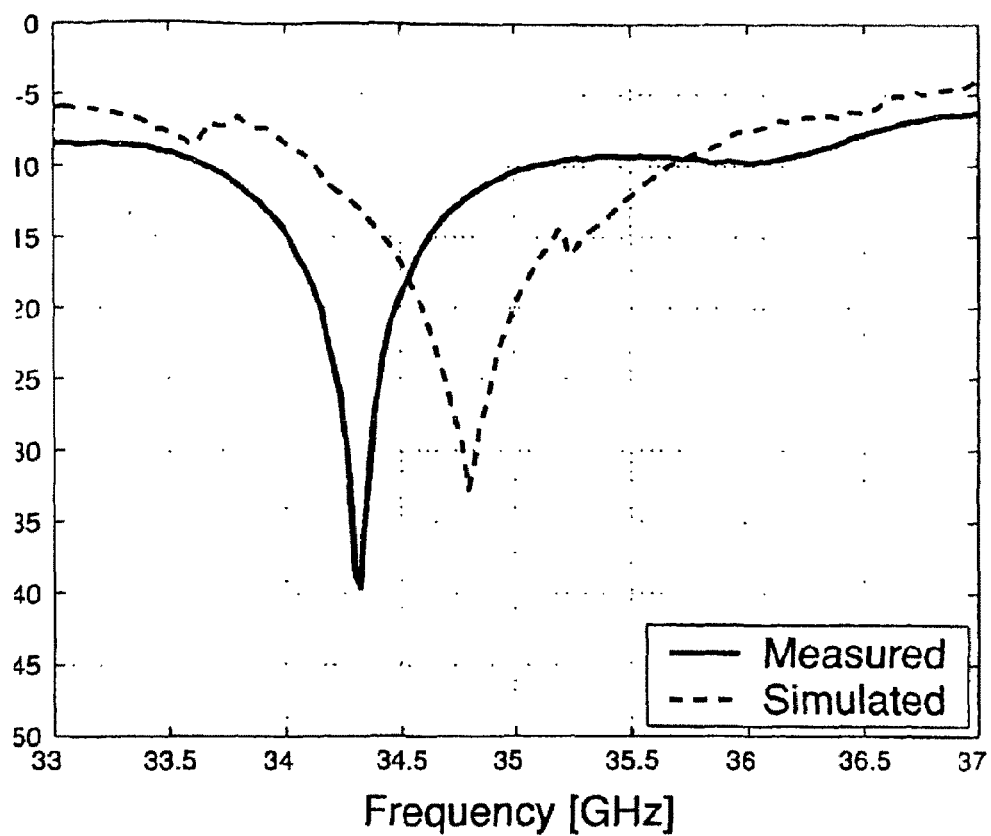
FIG. 7 is a chart depicting return loss of the 35 GHz array of the embodiment of FIGS. 3-4.

The simulated and measured return loss plots versus frequency are shown in FIGS. 6 (at 14 GHz) and 7 (at 35 GHz). The results are for the 135° polarization though they are the same for the 45° polarization also owing to the symmetric arrangement. The dual-frequency array was excited at one frequency, while the other array was treated as a parasitic element. The results are summarized in accompanying tables. The shift in the resonant frequency can be attributed to fabrication tolerances. The discrepancy in return loss at 14 GHz is due to the extension of the feedline of the embedded (14 GHz) antenna to a point where the top laminated layer of the substrate no longer covers the feedline, thus, modifying its characteristic impedance. The measured impedance bandwidths at both frequencies are in good agreement with those of the simulated designs.

Figure 8:
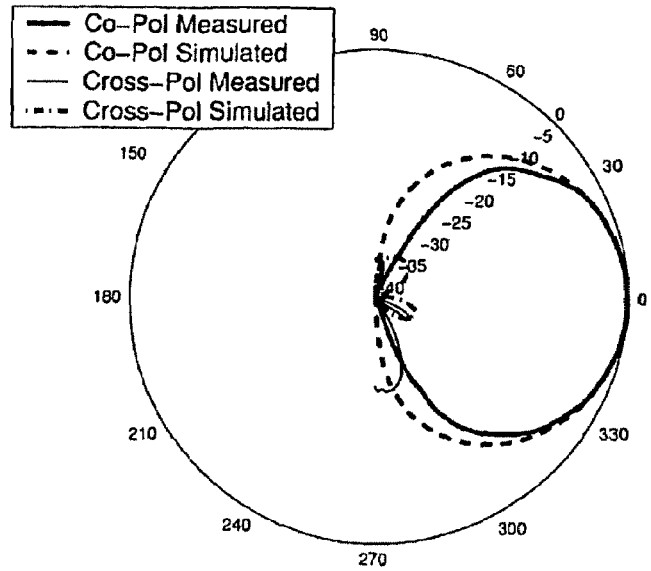
FIG. 8 is a diagram depicting the E-plane radiation pattern of the 14 GHz array of the embodiment of FIGS. 3-4.
Figure 9:
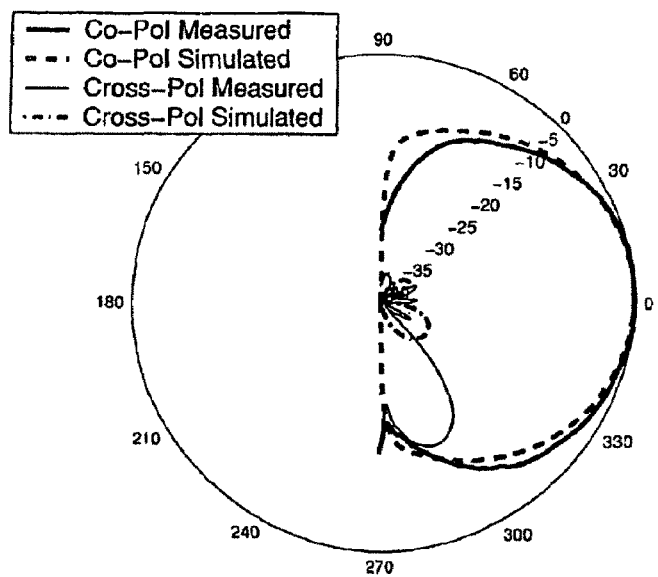
FIG. 9 is a chart depicting the H-plane radiation pattern of the 14 GHz array of the embodiment of FIGS. 3-4.
Figure 10:
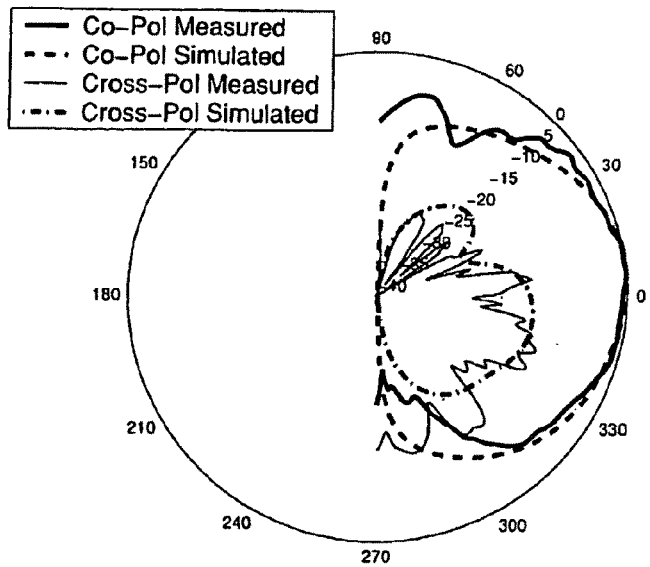
FIG. 10 is a chart depicting the E-plane radiation pattern of the 35 GHz array of the embodiment of FIGS. 3-4.
Figure 11:
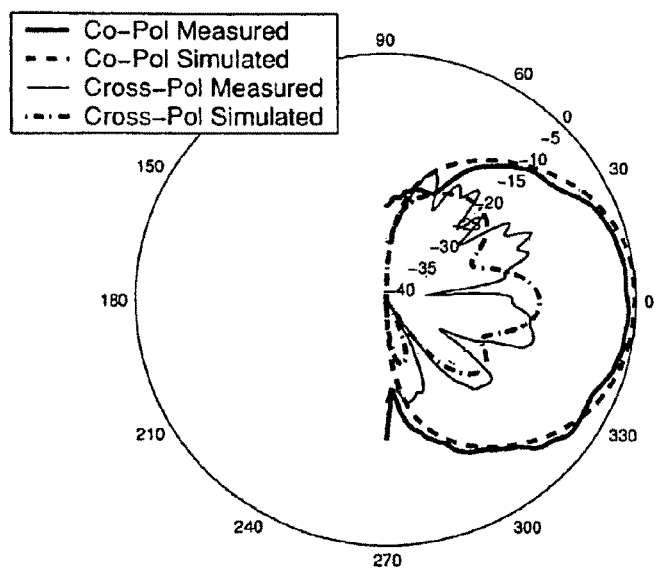
FIG. 11 is a chart depicting the H-plane radiation pattern of 35 GHz array of the embodiment of FIGS. 3-4.

Additionally, the simulated and measured two-dimensional radiation patterns are shown in FIGS. 8 and 9 for the E- and H-plane at 14 GHz, respectively, and FIGS. 10 and 11 for the E- and H-plane at 35 GHz, respectively. The results are summarized in the accompanying tables. The E-plane and H-plane beamwidths and the shapes of the co-polarized patterns are consistent for both the simulated and measured patterns of the 14-GHz array which is expected for a symmetric configuration. The center-to-center distance can be increased to reduce the E-plane beamwidth to a value close to the H-plane beamwidth, but side-lobes will start to form as a result of this increase. The measured cross polarization levels also agree well with the predicted values for scan angles less than 70°. The discrepancy at angles above 70° is due to the presence of the absorber as previously explained. In addition, it has been noted that the cross-polarization level tends to increase as the substrate thickness increases. Therefore, the higher frequency (35 GHz) antenna array on the electrically thicker substrate exhibits a worse cross-polarization level than the lower frequency (14 GHz) array on the electrically thinner substrate. Another design would involve placing the 35-GHz patches on a thinner (e.g., 4 mil) LCP substrate. To demonstrate the flexibility and mechanical stability of the multilayer LCP substrate, which is important for deployable antennas, antenna arrays were flexed several times and recharacterized. The return loss and radiation patterns were unchanged within the repeatability of the measurement equipment.

Thus, an embodiment of a multilayer electronic component system configured as a dual-frequency (14 and 35 GHz), microstrip antenna array with dual-polarization capabilities excited separately at each frequency for SOP RF front-ends has been presented for the first time on a flexible LCP multilayer substrate. The arrays exhibit a return loss of better than 15 dB in both frequency bands. The measured beamwidths were also in good agreement with the simulated results. The measured cross-polarization levels are higher than the predicted ones but can be improved by introducing a separate feed layer. The results shown here demonstrate the applicability of LCP for the development of low-cost, lightweight, and low-power RF front ends and antennas on an "all-package" solution for communication and remote sensing systems operating up to millimeter-wave frequency ranges.

As mentioned before, LCP is a relatively new, flexible thin film material with excellent properties for mm-wave passive circuits and printed antennas. The material's light weight and mechanically flexible nature makes it suitable for rolled, conformal, or other deployable antenna arrays and RF circuits. LCP has been shown to have promising electrical properties for applications above 10 GHz, but temperature testing on it has only been done up to 8 GHz. Since many of the desired LCP applications are at mm-wave frequencies, the material's dielectric characteristics under thermal variations are important to identify across the mm-wave range.

Two changes occur when the resonant structures under test are heated. A frequency shift of the resonant peak corresponds to a combination of the change in structure size and the change in the dielectric constant. Second, a decreasing Q-factor of the peaks with increasing temperature indicates an increase in dielectric loss.

LCP's temperature stability near 11 GHz is excellent. However, it slowly degrades with increasing frequency and it seems to converge to a nearly constant $\tau_{\in_r}$ value between 53 and 105 GHz. Overall, LCP's temperature stability is as good or better than the 10 GHz PTFE/glass and alumina temperature stability values. This is comparing LCP's stability over a nearly 100 GHz range while the others are for a $\tau_{\in_r}$ only at 10 GHz. Thus, LCP has an attractive temperature stability properties for mm-wave applications.

In this regard, the temperature dependent dielectric stability and transmission line losses of liquid crystal polymer (LCP) are determined from 11-105 GHz. Across this frequency range, LCP's temperature coefficient of dielectric constant, $\tau_{\in_r}$, has an average value of −42 ppm/° C. At 11 GHz the $\tau_{\in_r}$ is the best (−3 ppm/° C.), but this value degrades slightly with increasing frequency. This $\tau_{\in_r}$ average value compares well with the better commercially available microwave substrates. In addition, information for mm-wave frequencies is provided. Transmission line losses on 3- and 5-mil LCP substrates increase by approximately 20% at 75° C. and 50% or more at 125° C. These insertion loss increases can be used as a design guide for LCP circuits expected to be exposed to elevated operating temperatures.

In order to obtain these results, testing was conducted. In particular, LCP (R/flex 3850) material was provided by Rogers Corporation with double copper cladding in 2- and 4-mil thicknesses. In addition, 1 mil low melt bare LCP (R/flex 3908) bond layers were provided. Copper was etched from one side of the substrates by masking the bottom with polyester tape and using piranha etch to remove the copper on the top. Olin Copper Bond 5 μm copper foil was then bonded to the 2- and 4-mil single copper clad LCP core layers with the 1 mil LCP bond layer. The smooth 5 μm copper was used for reducing skin effect losses at high frequencies. The result was 3- and 5-mil LCP substrate heights. The bond was done in a Karl Suss SB-6 computer controlled silicon wafer bonder. The 5 μm copper was then patterned using a standard photolithography process. Shipley 1827 photoresist was used to define the pattern and ferric chloride was used to chemically etch the copper pattern. Acetone was used to strip the photoresist.

CBCPW-to-microstrip transitions fed the microstrip ring resonator configuration D found in D. C. Thompson, et al., "Characterization of liquid crystal polymer (LCP) material and transmission lines on LCP substrates from 30-110 GHz," Trans. on Microwave Theory Tech., vol. 52, pp. 1343-1352, April 2004, which is incorporated herein by reference. 110 GHz probes were used with the Agilent 851OXF network analyzer. First, a through-reflect-line (TRL) calibration was done with a set of CBCPW-to-microstrip transmission lines to calibrate out the transitions and set a reference plane on the microstrip feed line. The ring resonators were then measured to identify the locations of the resonant peaks. Once the resonant frequencies were established, a second TRL calibration was done with much finer frequency resolution around each peak. The peaks were calibrated with frequency resolutions varying between 1.25 MHz and 3.75 MHz. The hot chuck was initially set to 25° C. Calibrated S-parameters were then taken at 25, 50, 75, 100, and 125° C. Once the hot chuck reached each desired temperature, 10 minutes were given for the probes and attached coaxial cable to heat evenly and for the temperature to settle. An averaging factor of 256 was used for all measurements to reduce measurement noise. However, noise was still present in the measured data. Postprocessing using MATLAB was used to perform least-squares fits with each resonant peak to an analytical Gaussian distribution. The residuals were then checked to verify an acceptable fit. Using the fitted gaussian equation, the maximum amplitude point for resonant peak was then identified to the nearest 1 KHz. This value was used as the resonant frequency for each peak. One exception was made near the 21 GHz resonance where the resonant peaks were strongly distorted and did not fit the expected Gaussian distribution. This resonance frequency was thus left out of the analysis.

A consideration in taking a measurement with varying temperature is accounting for the expansion of the materials under test. The xy—CTE of LCP and the CTE of copper are matched at 17 [ppm/° C.]. The z-CTE of LCP is higher at 150 [ppm/° C.]. The measured resonant frequencies are thus a combination of both dielectric/metal dimension changes and changes in the dielectric constant. To separate these contributions, the equations from Thompson, et al. for converting the measured resonant frequencies to $e_e$ff and $e_r$ were carried out with the corrected expanded dimensions for the mean ring radius $r_m$, the substrate height h, and the strip width W at each temperature. These dimensional uncertainties as well as the uncertainty in the LCP zy-CTE (±3) were taken into account as shown by the error bars in FIG. 12.

Figure 12:
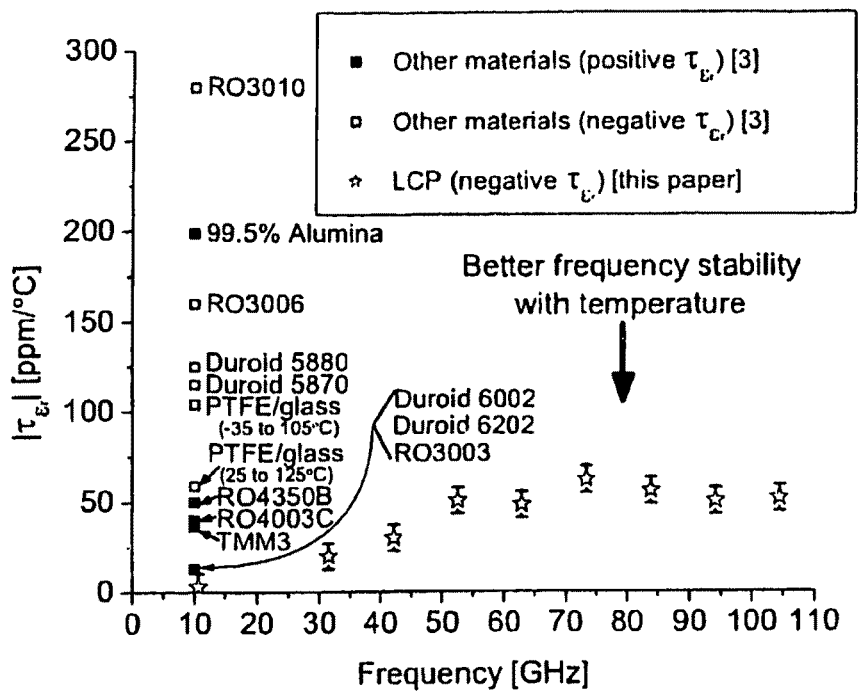
FIG. 12 is a chart depicting the absolute value of the thermal coefficient of a dielectric constant versus frequency of various materials.

In this regard, FIG. 12 shows the absolute value of the thermal coefficient of dielectric constant, $\tau_{\in_r}$, vs. frequency of several standard materials and of the broadband $\tau_{\in_r}$, for LCP. The closer $|\tau_{\in_r}|$ is to zero, the more stable the dielectric constant is with respect to temperature.

Figure 13:
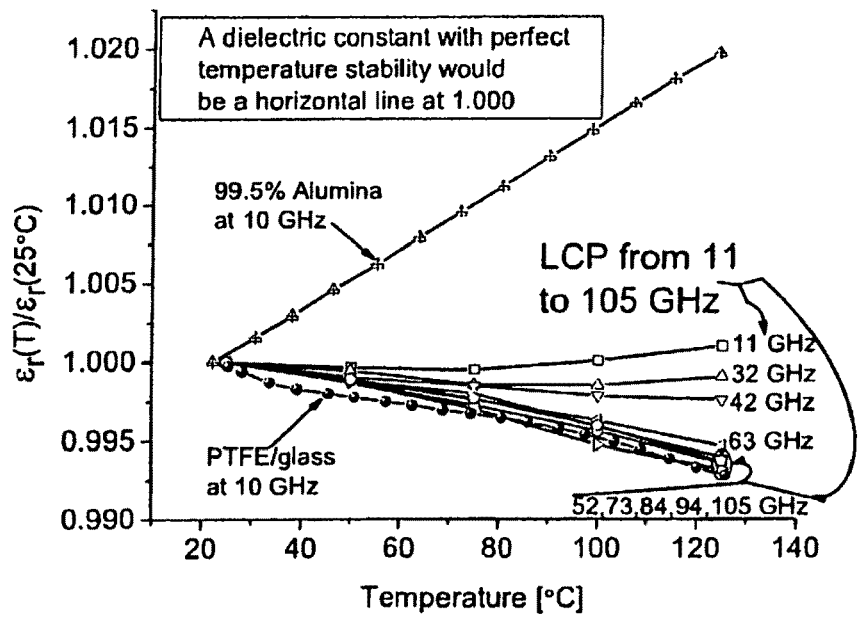
FIG. 13 is a chart depicting the ratio of LCP's heated dielectric constant and the dielectric constant of 25° C. versus temperature.

FIG. 13 shows the data in a different representation as normalized dielectric constant at 25° C. vs. temperature. The values for LCP are for measurements from 11-105 GHz. As a comparison, 99.5% alumina and PTFE/glass have been included. Notice that the values for 99.5% alumina and for PTFE/glass are for measurements at 10 GHz. This chart shows that the dielectric constant of LCP drops more sharply with increasing temperature at high frequencies.

Figure 14:
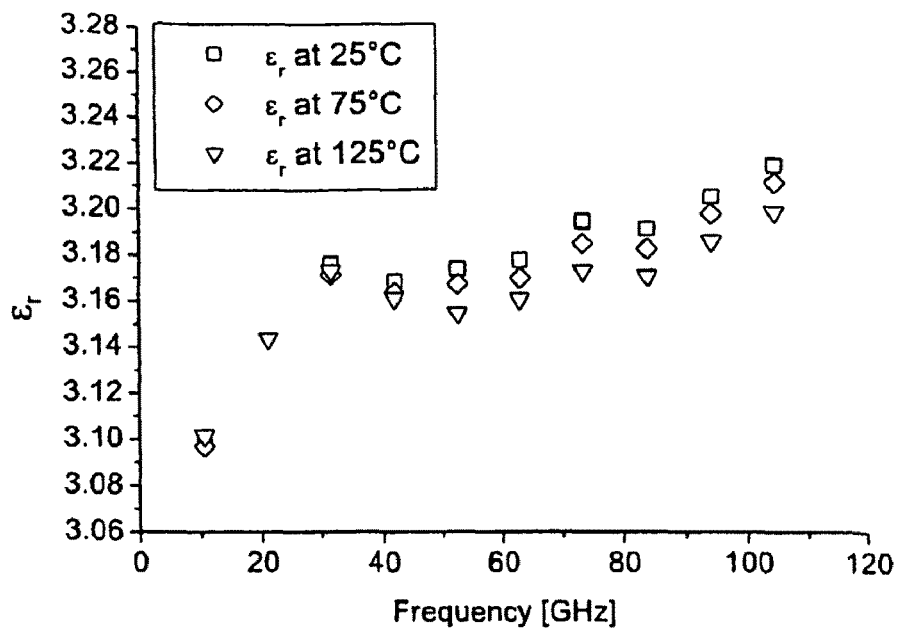
FIG. 14 is a chart depicting LCP's dielectric constant versus frequency and temperature.

FIG. 14 shows the actual values of LCP's dielectric constant vs. frequency and temperature. The dielectric constant increases with increasing frequency and decreases with increasing temperature. Note that the peak at 21 GHz did not have a well shaped Gaussian distribution and thus the resonant frequency could not be accurately calculated. However, the 21 GHz measurement at 125° C. was the best fit at that frequency and so only it is included for an estimate of the dielectric constant.

Figure 15:
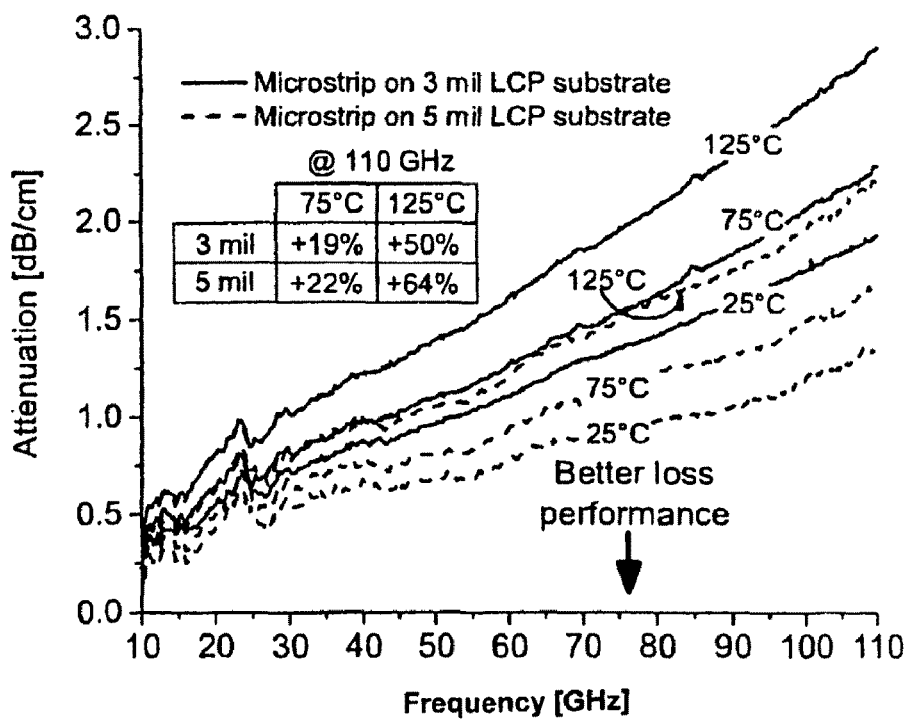
FIG. 15 is a chart depicting attenuation of 3- and 5-mil LCP substrate microchip transmission lines as a function of temperature.

At mm-wave frequencies, power becomes scarce and low insertion loss for transmission lines is important. Therefore, temperature dependent loss variations should be taken into account. Microstrip losses in dB/cm were extracted from the TRL calibration previously mentioned using Multical™ software. Losses are shown in FIG. 15 for 3- and 5-mil LCP substrate microstrip lines.

Microstrips on both substrate thicknesses experience increases in loss of approximately 20% for ΔT=50° C. and 50% or more for ΔT=100° C. at 110 GHz. The specific percentage values are shown in FIG. 15. Note that line width, W, was 104/μm for both lines which gave $Z_0$=68 Ω and 88 Ω for the 3- and 5-mil thicknesses, respectively. These loss increases should be accounted for in LCP circuits used at high temperatures.

Thus, LCP appears to be an excellent material for high temperature dielectric stability Lip to mm-wave frequencies. The average of the absolute values of $\tau_{\in_r}$ from 11-105 GHz is approximately −42 [ppm/° C.]. This is comparatively better than a majority of other standard microwave substrate materials in this parameter. The microstrip transmission line losses on LCP increased steadily with increasing temperature. Loss increases of approximately 20% and 50% or more were observed for temperature increases to 75° C. and 125° C., respectively. These loss increases should be considered for LCP transmission lines exposed to significantly elevated temperatures.

Figures 16A, 16B:
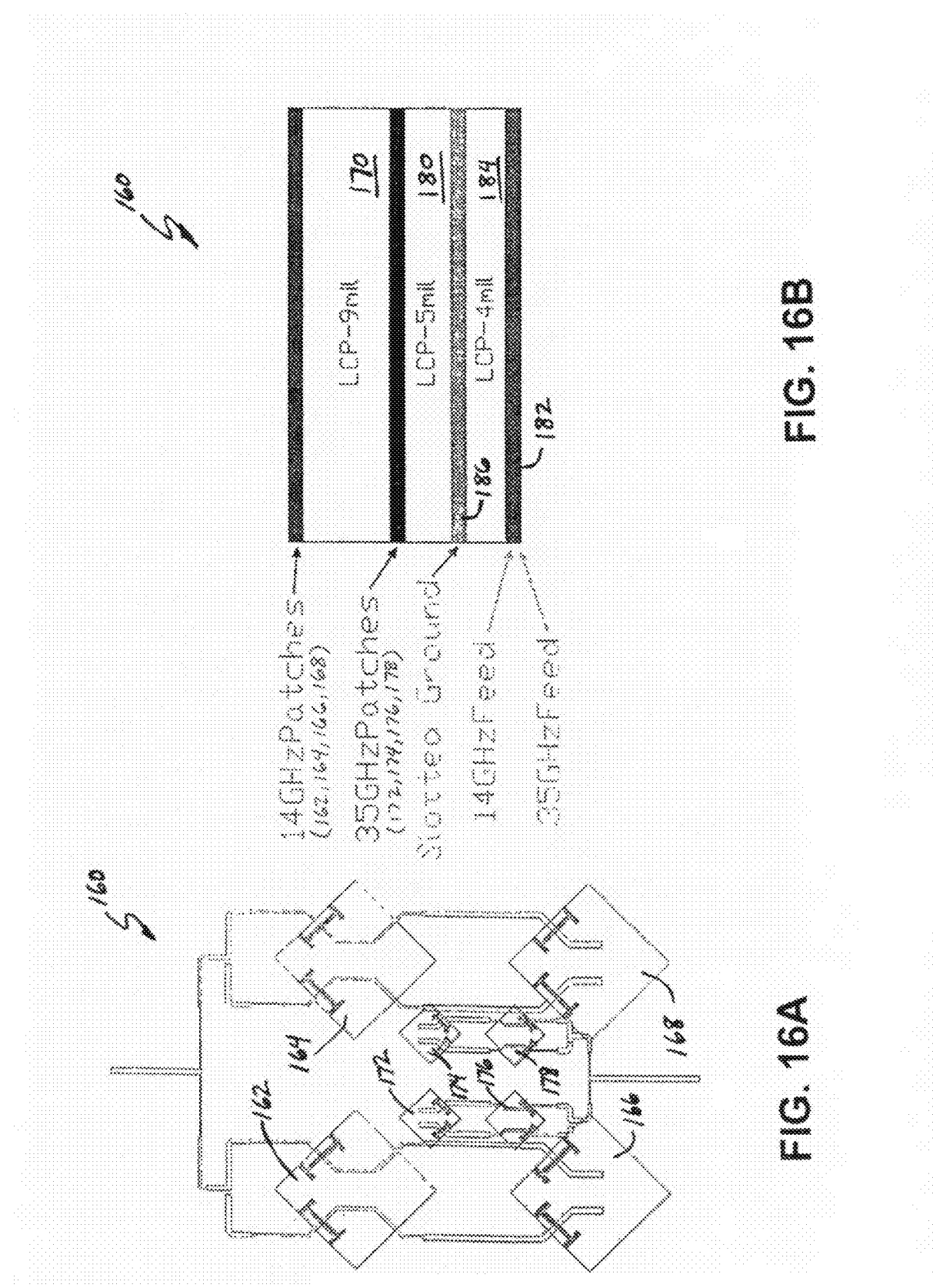
FIG. 16A is a top schematic view of another embodiment of a multilayer electronic component system.
FIG. 16B is a side schematic view of the system of FIG. 16A.
Figure 17:
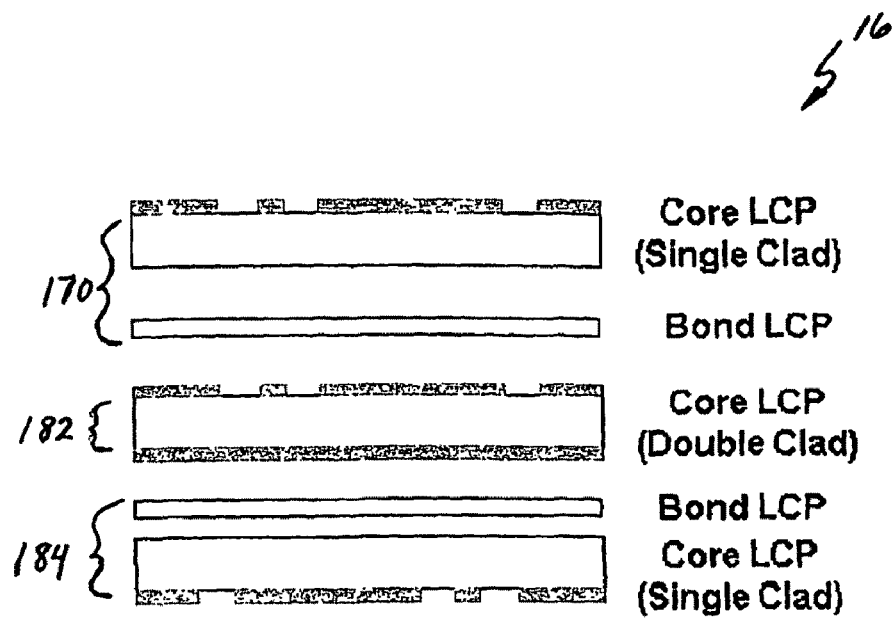
FIG. 17 is another side schematic view of the embodiment of FIG. 16A showing the various layers prior to assembly.
Figure 18:
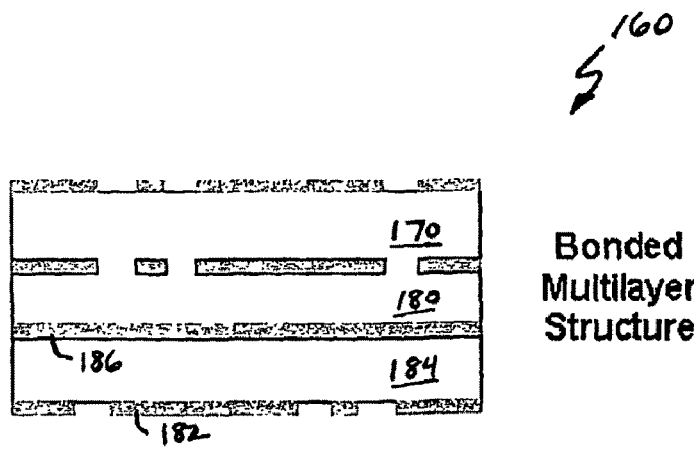
FIG. 18 is a side schematic view of the embodiment of FIG. 16A showing the multiple layers bonded together.

Another embodiment of a multilayer electronic component system will now be described with respect to FIGS. 16A-27. In this regard, FIGS. 16A and 16B depict top and side schematic views of a multilayer electronic component system 160 that is configured as an antenna array operating at 14 and 35 GHz. The 14 GHz patches 162, 164, 166 and 168 are located on the top layer 170 that has a substrate thickness of 14 mils. The 35 GHz patches 172, 174, 176 and 178 are embedded on a lower layer 180 that has a substrate thickness of 5 mils. Such an arrangement was chosen to reduce cross polarization at 35 GHz. The positioning of the patches was selected to reduce side lobes while reducing blockage effects.

An aperture-coupled feeding mechanism is used for both arrays to reduce parasitic radiation from the feed network. The feed network 182 is located on a 4 mil LCP layer 184 beneath the ground plane 186. The 2×2 array at each frequency includes two linear sub-arrays (two 1×2 arrays) that are serially fed. A corporate feed network is employed to connect the linear sub-arrays. The feed network is optimized to ensure in-phase feeding of all the elements. The polarization of the antenna elements can be switched using a MEMS switch. The polarization directions are at 45° and 135° as opposed to the conventional x-y directions. As a first modeling step, the switching of polarizations is controlled by the presence of hardwired perfect short and open conditions simulated by a continuous feedline and an unloaded 200 μm gap respectively. EMPicasso™ was used for design and simulations.

Two types of LCP material with different melting temperatures were used. Type-I LCP with high melting temperature (315° C.) is used for core layers while type-II LCP with low melting temperature (290° C.) is used for bonding layers (see FIG. 17). The core layers were first fabricated on type-I LCP substrate using photolithographic processes. The layers were then bonded together using interleaved bonding layers to produce the multilayer LCP structure (see FIG. 18). Note, FIGS. 19A-19D depict various faces of the core layers prior to bonding to form the multilayer structure.

Alignment of the layers was performed using laser-drilled holes with positional accuracy of 25 μm or better. Such accuracy is preferred as the resonance behavior of the array is very sensitive to the relative positioning of the slots and the patch elements. Several experiments were performed to optimize the temperature profile and the tool pressure to achieve reliable bonding while preventing shrinkage, formation of bubbles and melting of core layers.

Figures 20, 21:
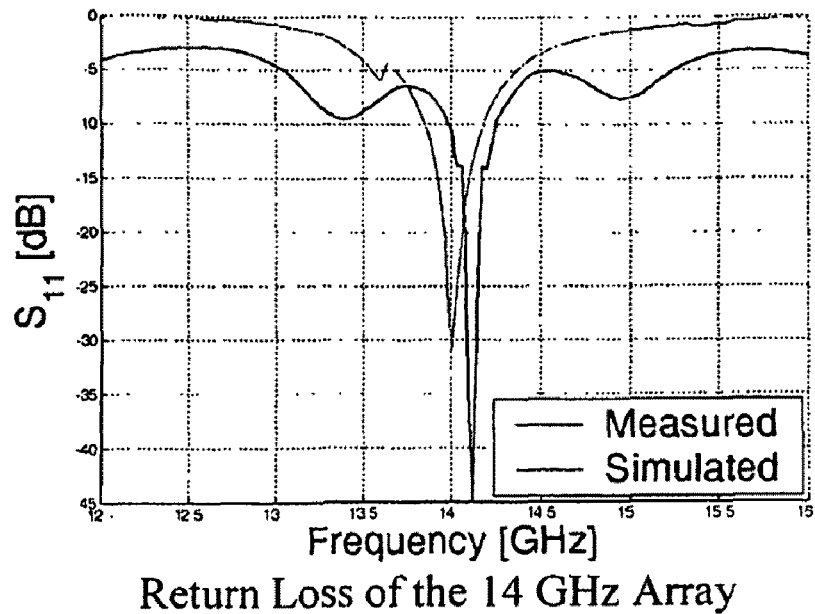
FIG. 20 is a chart depicting return loss of the 14 GHz array of the embodiment of FIG. 16A.
FIG. 21 is a chart depicting various simulated and measurement return losses from the chart of FIG. 20.

Return loss measurements were carried out with a vector network analyzer using a 2.4 mm coaxial-to-microstrip connector. A short, open, load and thru (SOLT) calibration was performed with the end of the coaxial cable fixed as the reference plane. FIG. 20 shows the simulated and measured return loss of the 14 GHz array while the feed network of the 35 GHz array was left open circuited. Excellent agreement with the simulation results has been achieved. The impedance characteristics of the 14 GHz array are summarized in FIG. 21.

Figure 22:
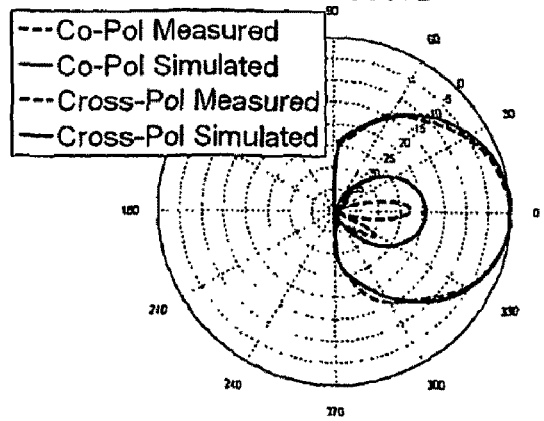
FIG. 22 is a chart depicting the E-plane radiation pattern of the 14 GHz array of the embodiment of FIG. 16A.
Figure 23:
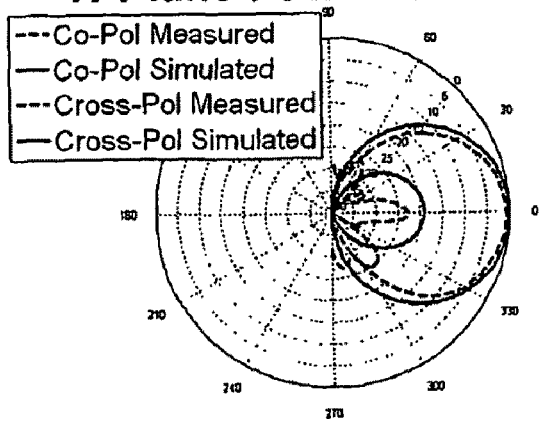
FIG. 23 is a chart depicting the H-plane radiation pattern of the 14 GHz array of the embodiment of FIG. 16A.

Additionally, the simulated and measured two-dimensional radiation patterns are shown in FIGS. 22 and 23 for the E- and H-plane at 14 GHz, respectively. The results are summarized in the accompanying tables.

Figures 24, 25:
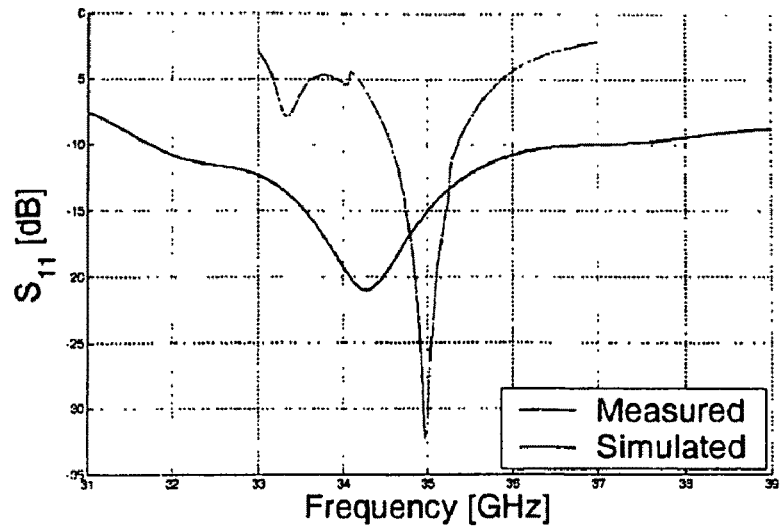
FIG. 24 is a chart depicting return loss of the 35 GHz array of the embodiment of FIG. 16A.
FIG. 25 is a table depicting various data points from the chart of FIG. 24.

FIG. 24 shows the simulated and measured return loss of the 35 GHz array while the 14 GHz array was treated as a parasitic element. While measuring the 35 GHz array, launching problems were identified between the coaxial connector and the microstrip feed. Gating method is used, therefore, to measure the return loss. Since the array cannot be completely isolated from the launcher, only the resonant frequency was accurately determined. The impedance characteristics at 35 GHz are summarized in FIG. 25.

Figure 26:
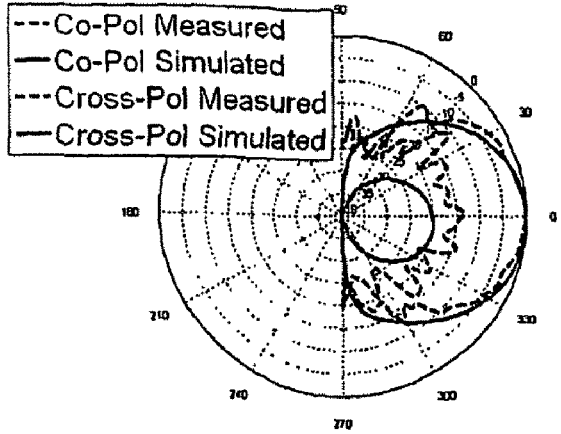
FIG. 26 is a chart depicting the E-plane radiation pattern of the 35 GHz array of the embodiment of FIG. 16A.
Figure 27:
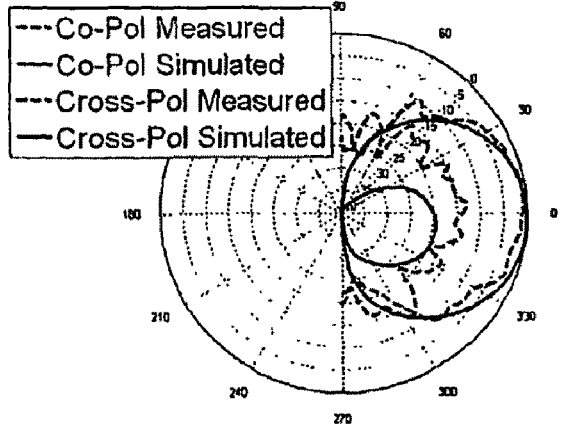
FIG. 27 is a chart depicting the H-plane radiation pattern of the 35 GHz array of the embodiment of FIG. 16A.

Additionally, the simulated and measured two-dimensional radiation patterns are shown in FIGS. 26 and 27 for the E- and H-plane at 35 GHz, respectively. The results are summarized in the accompanying tables.

Figure 28:
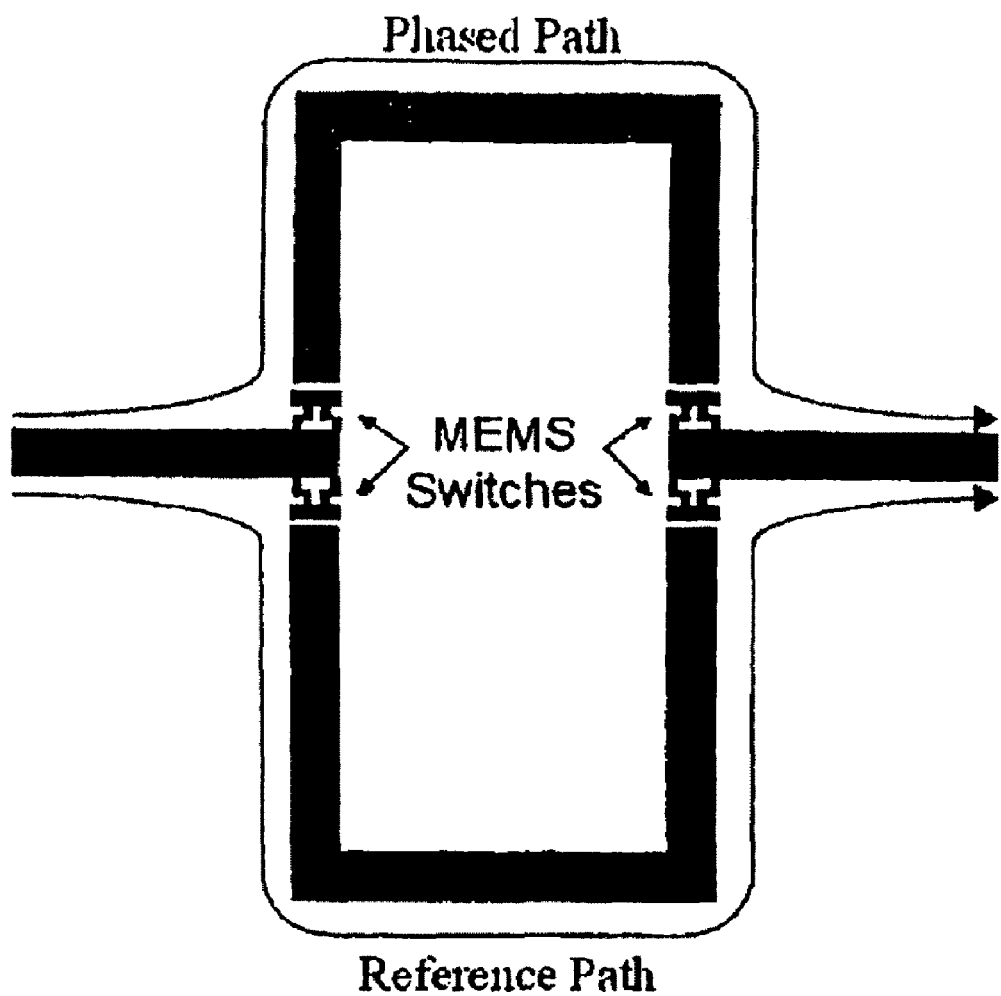
FIG. 28 is a schematic view of an embodiment of a phase shifter that can be incorporated into a multilayer electronic component system.

An embodiment of a MEMS phase shifter that can be used in a multilayer electronic component system, such as those configured as antenna arrays, will be described with respect to FIGS. 28-31. In this regard, FIG. 28 schematically depicts a MEMS phase shifter 280 incorporating a switched-line design. By splitting a signal into a reference path with a length of one wavelength (or an integer multiple of the wavelength) and a second path that adds or subtracts a fraction of a wavelength, a net phase shift is achieved. For example, if a phase shift of 90° is desired, 90°/360° or ¼ of a wavelength would be the difference in length between the phased path and the reference path.

Several one-bit phase shifters were designed at 14 GHz and fabricated with phase shifts of 0°, 22.5°, 45° and 90°. The reference path (0°) has a length of one wavelength (1.361 cm) and the 22.5°, 45° and 90° phased paths have lengths of $^{15}/_{16}\lambda$ (1.276 cm), $^{7}/_{8}\lambda$ (1.191 cm) and $^{3}/_{4}\lambda$ (1.021 cm), respectively. In addition, the 45° and 90° phase shifters were cascaded in series to obtain a two-bit phase shifter. The possible phase shifts with such an embodiment are 0°, 45°, 90° and 135°.

Notably, MEMS switches can be ideal for switched-line topologies because of the excellent isolation they can provide. In order to apply the necessary bias voltage to actuate the MEMS switches, radial stubs were located along each of the two signal paths. When a DC voltage is applied to the radial stub, electrostatic force pulls the switch (which is grounded) towards the signal line. A layer of silicon nitride deposited over the signal line prevents switch metal to signal line metal contact. Therefore, no DC current can flow but the capacitance between the switch and the signal line is large enough for RF energy to pass through.

Since fabrication is conducted on a flexible, organic substrate, the substrate can be prone to curling. This effect may become more pronounced throughout processing due to the fluctuation of temperature from the various baking, deposition, and etching steps. Since hard contact optical lithography with a 3-5 μm resolution typically can not be performed on a curled substrate, it may be necessary to mount the sample to a flat, cleanroom grade material before processing. Temporary mounting can be done using a spin-on or roll-on adhesive, for example. Permanent mounting can be done using a thermal bonding machine.

Since the substrate is also a polymer, surface roughness may be present. The surface roughness is usually on the order of 5-10 μm. Given that the MEMS switch is generally suspended 2-3 μm above the substrate, the surface roughness can be large enough to prevent the switch from deflecting. To solve this problem, each sample can be polished, such as mechanically using an alumina slurry, for example. After polishing, the sample should exhibit a surface roughness between 10-50 nm, which should be smooth enough for MEMS switch operation.

Figure 29:
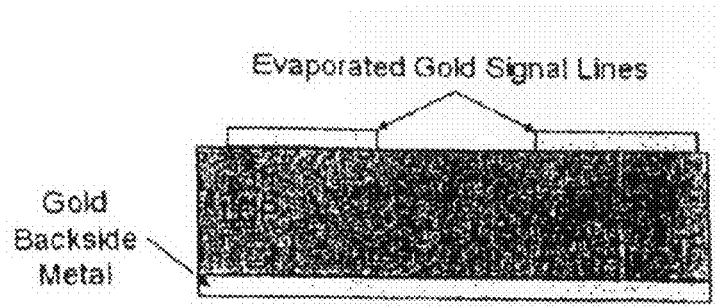
FIG. 29 is a schematic side view of a MEMS switch, utilized by the phase shifter of FIG. 28, shown during an intermediate fabrication step.
Figure 30:
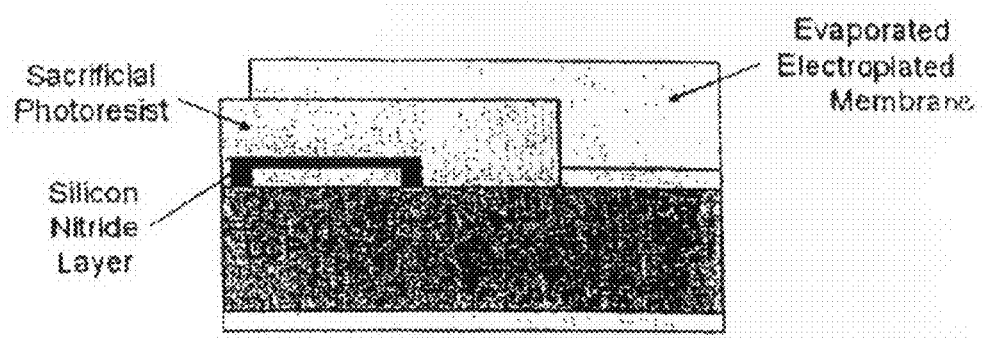
FIG. 30 is a schematic view of the MEMS switch, utilized by the phase shifter of FIG. 28, shown during another intermediate fabrication step.
Figure 31:
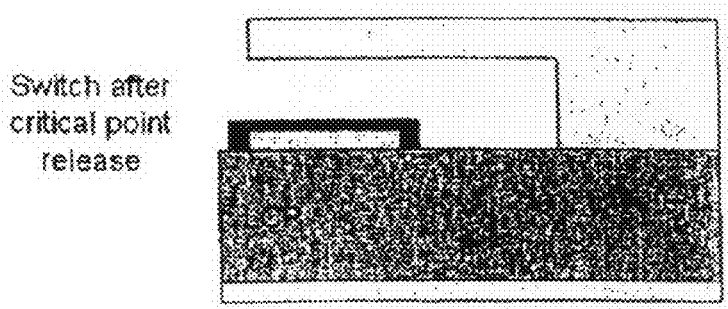
FIG. 31 is a schematic view of an embodiment of the MEMS switch, utilized by the phase shifter of FIG. 28, shown after fabrication.

An embodiment of a method of manufacturing a MEMS phase shifter incorporating a MEMS switch is depicted in the sequential schematic side views of FIGS. 29-31. As shown in FIG. 29, after polishing and mounting to a flat material, gold transmission lines are electron beam evaporated and patterned using hard contact optical lithography. A silicon nitride ($Si_3N_4$) layer is deposited using low-temperature Plasma Enhanced Chemical Vapor Deposition (PECVD) (see FIG. 30). The silicon nitride was then etched using a Reactive Ion Etch (RIE) process everywhere except for the MEMS switch contact areas. Photoresist was patterned to provide a sacrificial layer for the MEMS switches. Gold for the switch membrane was evaporated, patterned, electroplated to the desired thickness, and etched. The sacrificial layer was stripped away leaving the MEMS switches suspended above the signal lines (see FIG. 31). The sample was dried using carbon dioxide ($CO_2$) at the supercritical point to prevent switch collapse due to water surface tension.

Using components manufactured by the process described above, measurement results were taken using DC probes to apply the switch bias voltage. Thru-Reflect-Line (TRL) calibration was performed to remove the connector and cable losses. The transmission line loss over the frequency range 12-16 GHz varies from 0.35-0.40 dB/cm. At 14 GHz, the line loss is 0.375 dB/cm. Given that the line lengths vary from 1.021 cm to 1.361 cm, it is expected that 0.38 dB to 0.51 dB of line loss will be present per bit. The MEMS switch loss varies slightly from switch to switch due to fabrication tolerances. However, the loss ranges from 0.08 dB to 0.16 dB per switch. These values are typical for MEW switches in the down (actuated) state at this frequency.

Figure 32:
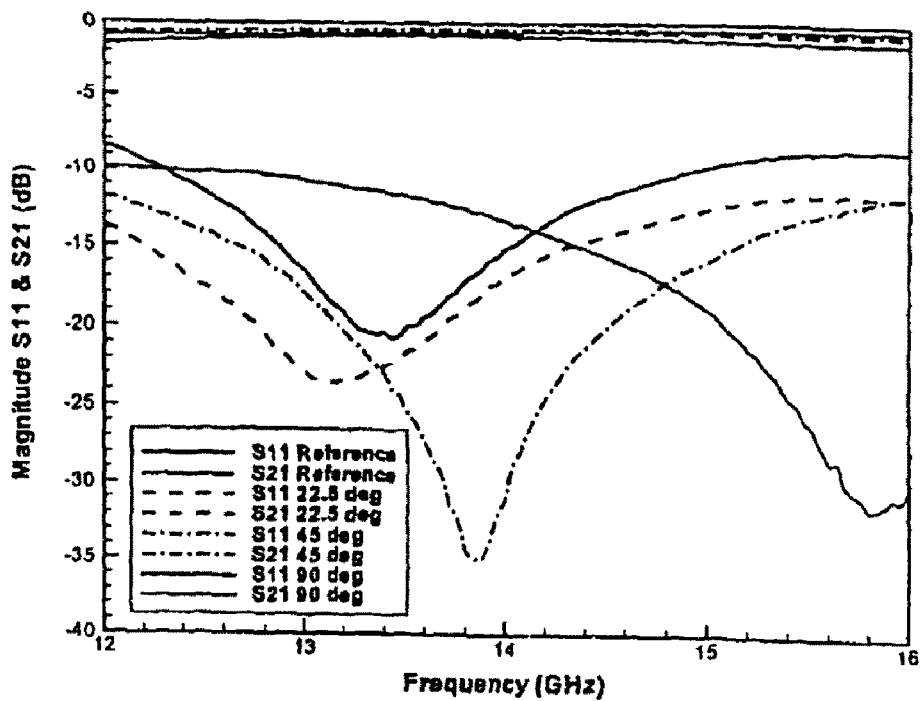
FIG. 32 is a chart depicting loss measurement results of MEMS 1-bit phase shifters.
Figure 33:
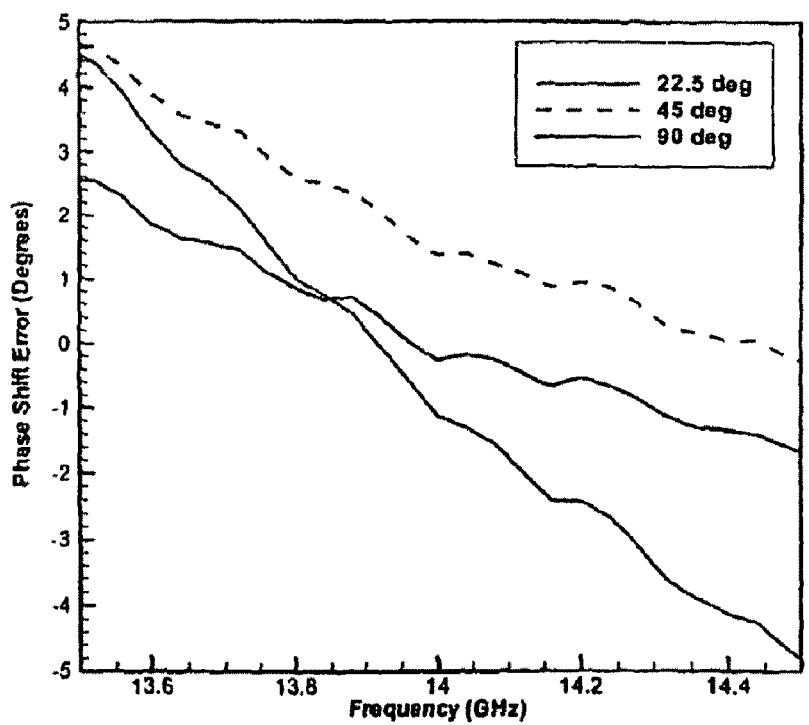
FIG. 33 is a chart depicting phase measurement results of MEMS 1-bit phase shifters.

Measurement results are very good for the one-bit MEMS phase shifters. The average return loss is 19.0 dB and the average insertion loss is 0.59 dB. The phase error is less than 1.38° from the desired phase shift for all frequencies. These results are shown in FIGS. 32 and 33 centered around the design frequency.

Figure 34:
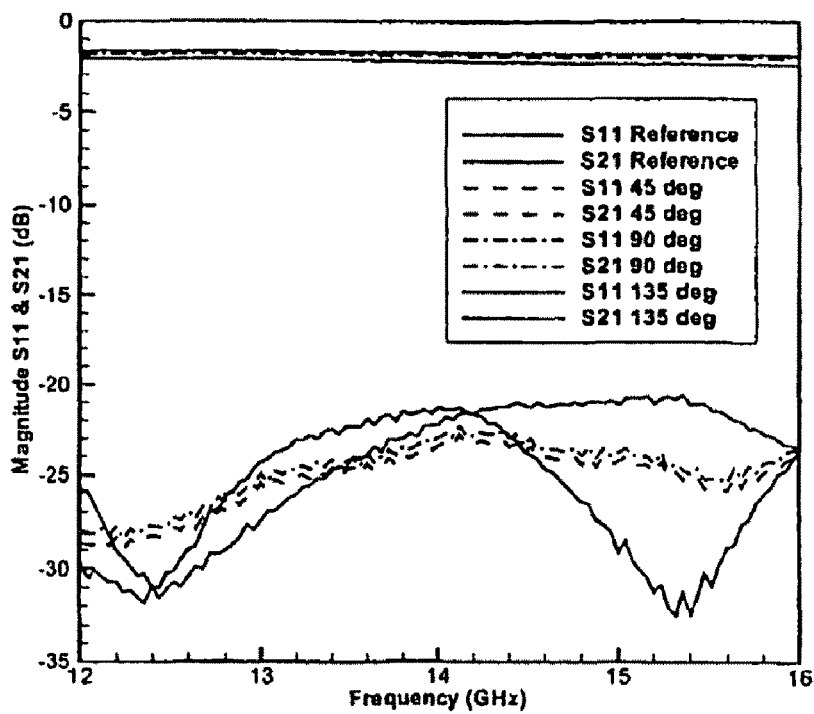
FIG. 34 is a chart depicting loss measurement results of MEMS 2-bit phase shifters.
Figure 35:
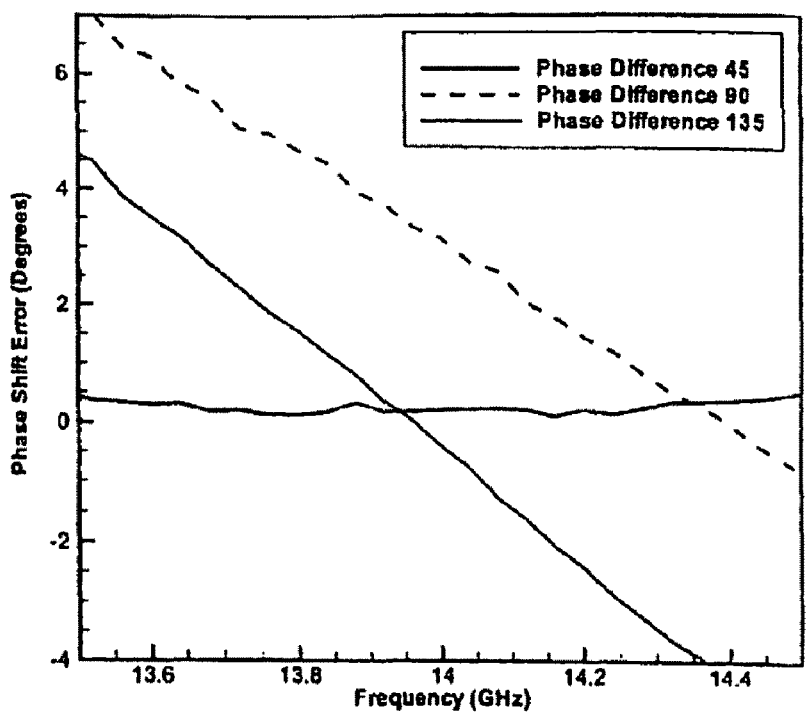
FIG. 35 is a chart depicting phase measurement results of MEMS 2-bit phase shifters.

Measurement results for the two-bit MEMS phase shifters are also very good. The average return loss is 22.5 dB at the design frequency. The average insertion loss is 0.98 dB per bit. The average phase error is only 1.26°. These results are shown in FIGS. 34 and 35 centered around the design frequency.

Another embodiment of a phase shifter will now be described. Specifically, a four-bit MEMS phase shifter that is fabricated on, integrated, and packaged into an organic, flexible, low permittivity LCP material will be described.

In this regard, four-bit phase shifters have been documented in various system-on-chip (SOC) devices. They have been published on various materials, including silicon and GaAs. Various switching elements have been used including FETs, PIN diodes, and in recent years MEMS. Currently published four-bit phase shifter papers have several shortcomings. First, they are all fabricated on non-organic substrates. Some of these substrates are costly, such as GaAs. Second, many of them use solid-state switching elements. PIN diodes, FETs, and other solid state switches are typically lossier, consume more power, and have more distortion at high frequencies than MEMS switches. Third, none of the published four-bit phase shifters are packaged.

As will be discussed, integrating RF devices in an all-LCP package does not require any additional design considerations on the devices themselves. That is, the design of the MEMS phase shifter can be done completely independent of the packaging layout. Therefore, each of these topics are explained separately.

The LCP material used for this embodiment has a thickness of 25 μm or 100 μm, a permittivity ($\in_r$) of 3.1, and a tan δ of 0.004. To demonstrate that a MEMS phase shifter can be enclosed in an all organic, flexible package, a four-bit switched-line microstrip phase shifter was designed at 14 GHz for phase shifts between 0° and 337.5° in 22.5° increments (16 cases). Traditional microstrip theory was used to design the phase shifter. A layout of the final four-bit phase shifter is shown in FIG. 36.

The phase shift is related to the change in length between the reference and the phased path. This is described mathematically by Equation 1 where ΔΦ is the phase difference (deg), λ is the wavelength, and l is the line length.

$$\Delta\Phi = 360/\lambda (l_{phased\ path} - l_{reference\ path}) \quad (1)$$

Figure 36:
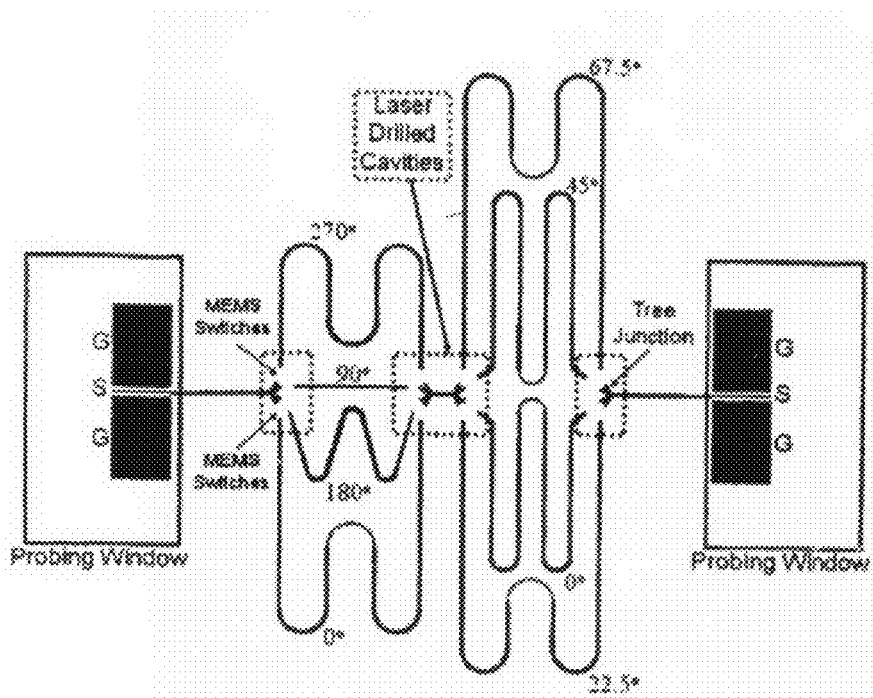
FIG. 36 is a schematic view of another embodiment of a phase shifter.
Figure 37:
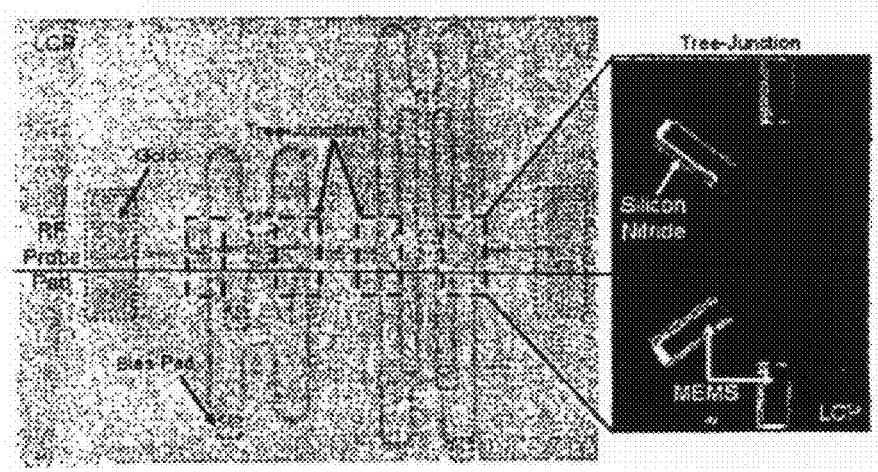
FIG. 37 is a composite view showing an embodiment of a fabricated MEMS phase shifter substrate in which the superstrate has been removed, with cutouts representing the location of the cavities and probing windows.

In order to apply the necessary bias voltage to actuate the MEMS switches, bias pads were designed and placed on each of the signal paths (not shown in FIG. 36). When a DC voltage is applied to the bias pad, electrostatic force pulls the switches (which are DC grounded) towards the signal line. A layer of silicon nitride deposited over the signal line prevents switch metal to signal line metal contact. Therefore, no DC current can flow but the capacitance between the switch and the signal line is large enough for RF energy to pass through. The down state capacitance of the MEMS switch is approximately 2.5-4 pF and the up state capacitance is approximately 90 fF. An embodiment of a fabricated four-bit phase shifter with bias pads is shown in FIG. 37.

The phase shifter signal lines and MEMS switches were fabricated on the LCP substrate. In addition, a piece of 25 μm thick LCP bond ply layer was placed on top of the fabricated substrate. This layer is electrically the same as the thicker 100 μm material but it melts at a slightly lower temperature. To prevent the MEMS switches from being damaged by the second LCP layer, three cavities were laser-micromachined to expose each of four tree-junctions, which contain four MEMS switches each. The middle two tree-junctions share a cavity due to their close proximity.

Figure 38:
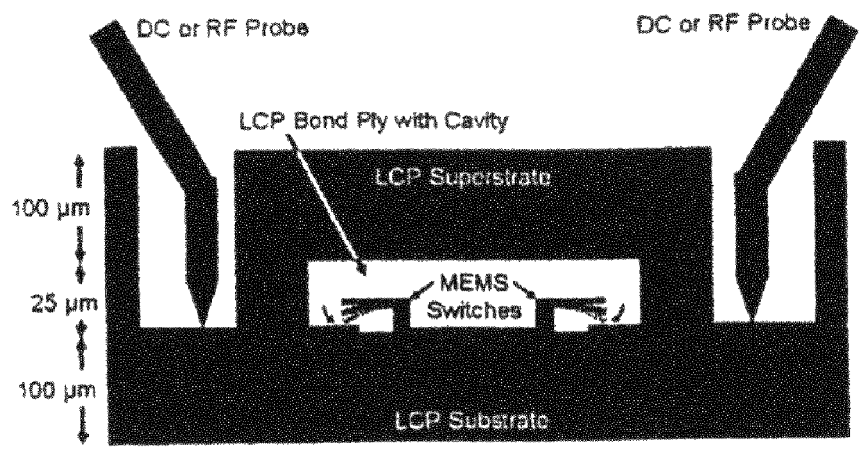
FIG. 38 is a side schematic view of an embodiment of packaged MEMS switches at a tree-junction.

All of the windows and cavities were micromachined using a $CO_2$ laser. These holes align with the switches on the substrate layer to create a cavity large enough and deep enough to prevent contact between the switches and the cavity walls. On top of these two layers of LCP, a third layer of 100 μm thick LCP is stacked to complete the package. In order to access the metal signal lines from outside the package with DC or RF probes, windows over the bias pads were laser etched in the middle and top layers to allow direct contact. The DC bias pads were connected to a voltage source through a high impedance DC probe. The placement of the windows and cavities is demonstrated in FIG. 37. A side view of the laser drilled cavities and packaged MEMS switches is shown in FIG. 38.

Figure 39:
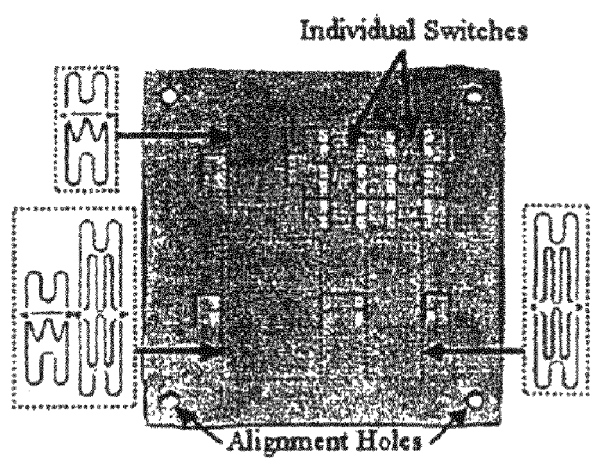
FIG. 39 is a top schematic view of an embodiment of two and four-bit phase shifters and six individual MEMS switches on LCP.

By using an all-LCP package, the protected device(s) should benefit from the low-loss and near-hermetic nature of the packaging material. Additionally, this packaging technique may be ideal for applications that require flexible circuits. The superstrate can be permanently bonded to the substrate using thermocompression, ultrasonic or laser bonding, for example. A top view of an embodiment of an LCP sample that has been packaged using thermocompressive bonding is shown in FIG. 39.

It has been demonstrated that single RF MEMS switches can be packaged using this technique. That is, the fabricated switches are sandwiched between two layers of LCP with a cavity to protect the MEMS devices. Since the permittivity of LCP is approximately 3.1, which is close to the permittivity of air ($\in_r$=1), the presence of the superstrate has a minimal effect on the overall device performance.

Figure 40:
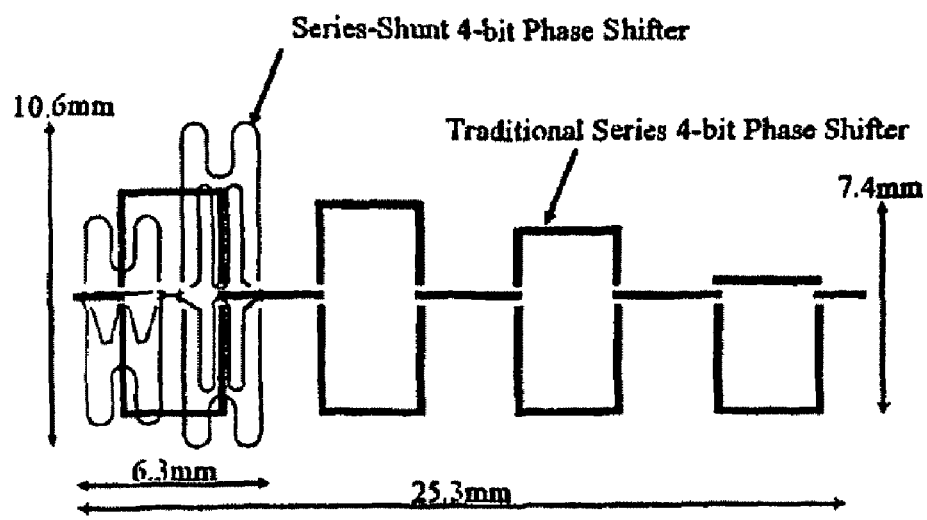
FIG. 40 is a schematic diagram depicting size compression of an embodiment of a 4-bit series—shunt design with traditional series switched line phase shifter.

Switched-line phase shifters are widely used because they are straight-forward to design, fabricate, and integrate with other microwave devices. Unfortunately, the overall size of the switched-line geometry is comparable to the wavelength for each bit. Since multi-bit phase shifters are usually desired, this can result in a phase shifter that is much larger than the other microwave components in an RF system. For this reason, a number of changes were made to the traditional layout to decrease the size. These design changes are detailed below. By incorporating these layout changes, the overall area was reduced by a factor of 2.8. The length was reduced by a factor of four. In addition to the size reduction, the line length and number of MEMS switches traversed compared to a traditional implementation were each reduced by a factor of two. This results in half the line loss and half the switch loss by using this implementation. A size comparison of the modified layout compared to a traditional layout is shown in FIG. 40.

Instead of cascading four one-bit phase shifters in series (as demonstrated in FIG. 40), four shunt-phased paths were cascaded with another four shunt-phased paths (hence the series-shunt distinction). This was demonstrated in FIG. 36. In order to generate all sixteen possible cases, a 0° reference path must occur in every series portion of the phase shifter. In addition, the 0°, 90°, 180° and 270° phased paths must be in the first section and the 0°, 22.5°, 45° and 67.5° phased paths must be in the second section to create all 16 cases. In order to make this feasible for really short phased paths (like the 22.5° case) and really long phased paths (like the 270° case), the shortest phased paths were elongated by a wavelength. This is why the smallest phase shifts have longer line lengths than the largest phase shifts.

This series-shunt technique was previously published by the University of Michigan and Rockwell Scientific using Single Pole Four Throw (SP4T) MEMS switches. The switches used are SP4T as well, but they are implemented differently. For example, we chose not to use via holes, which add an unnecessary level of complexity to the design and fabrication. The switches presented offer the same loss performance without the use of vias. Previous works that claim "small," "reduced" or "miniature" size multibit phase shifters always use high dielectric materials, such as silicon or GaAs, that have permittivities between 11 and 13. This is because the wavelength of a microstrip line is inversely related to the square root of the permittivity. Microstrip phase shifters on high dielectric materials will typically be much smaller than those on low dielectric materials. Notably, this embodiment appears to be the first small size four-bit phase shifter presented on a low dielectric material.

Instead of using the standard 50 Ω input impedance, 100 Ω was used. By making this change, the line width decreased from 240 μm to 65 μm. This allowed for more signal lines to be placed in less area. In practice, high impedance patch antenna arrays which would utilize this type of phase shifter are not uncommon. However, a 50 Ω to 100 Ω transition could be added for integration with other standard microwave components.

Figure 41:
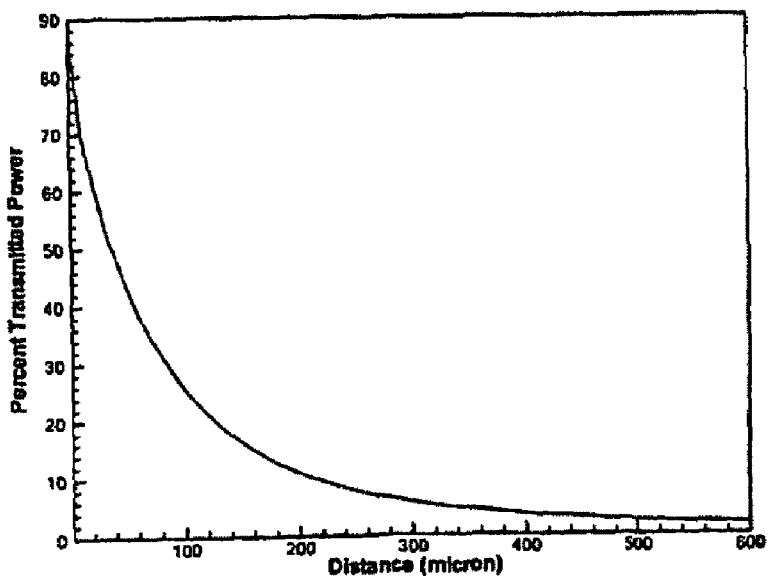
FIG. 41 is a graph depicting percentage of power transmitted between coupled signal lines for a given spacing at 14 GHz.

Instead of using the traditional rectangular phased paths, the lines were curled inward to minimize the overall area (as shown in FIGS. 36 and 40). Since multibit phase shifters are often used to steer antenna arrays, it is preferable to keep the overall size as small as possible. Careful attention was given to minimize coupling between the signal lines. A full wave HP-ADS Momentum (method of moments) simulation was performed to determine the amount of coupling that would result between two 65 μm wide, 2.5 mm long signal lines at 14 GHz. These results are shown in FIG. 41.

Most of the distancing between signal lines used in the layout is 300-400 μm, which corresponds to 5.8-3.6% transmitted power. However, in some areas, distances as small as 150 μm were necessary. The lines in these areas were placed at oblique angles to each other to minimize the coupling.

Figure 42:
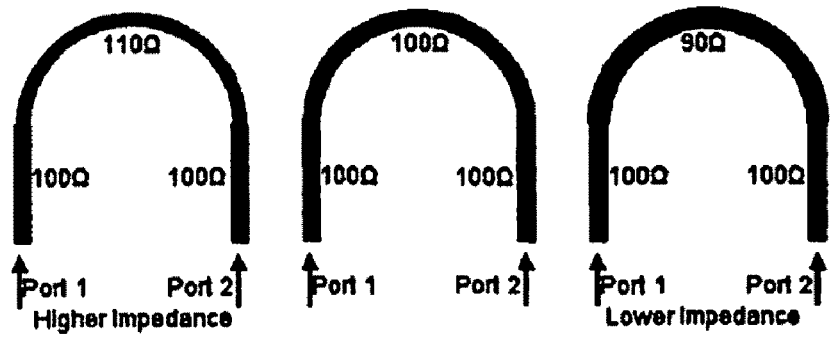
FIG. 42 is a schematic diagram depicting an embodiment of an iterative method for performing impedance matching.

Since curved microstrip lines are being used to reduce the size, impedance matching should be done to compensate for the additional parasitic impedance. Instead of using additional matching devices, such as stubs, all impedance matching was handled through the signal lines themselves. Lines that require a higher impedance match were made thinner and lines that require a lower impedance match were made wider. This was performed in a full-wave simulator using an iterative method as demonstrated in FIG. 42.

Figure 43:
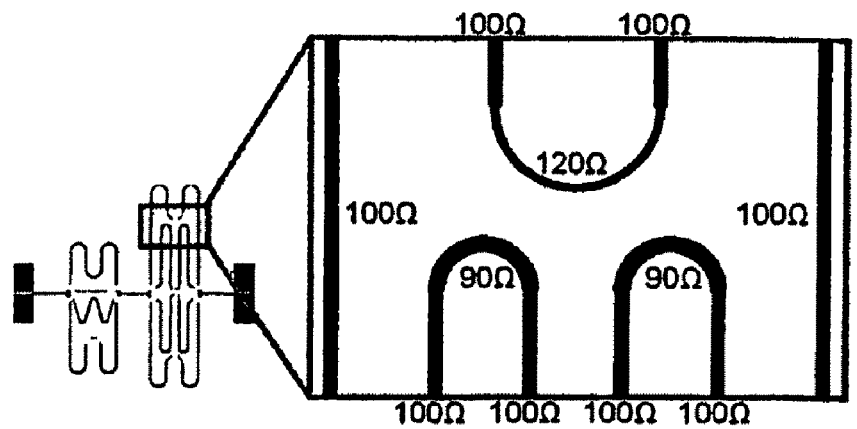
FIG. 43 is a schematic diagram depicting optimal impedance values for a section of an embodiment of a phase shifter.

Since the arcs are the shortest part of the signal line, they were used to do the impedance matching. The center case in FIG. 42 uses a curved line with the device characteristic impedance (100Ω). The leftmost case has a slightly higher impedance and the rightmost case has a slightly lower impedance. The impedance was varied until the lowest insertion loss was achieved. The overall size of the circuit does not change by using this method of impedance matching. The optimized impedance values for a section of the phase shifter are shown in FIG. 43.

Figure 44:
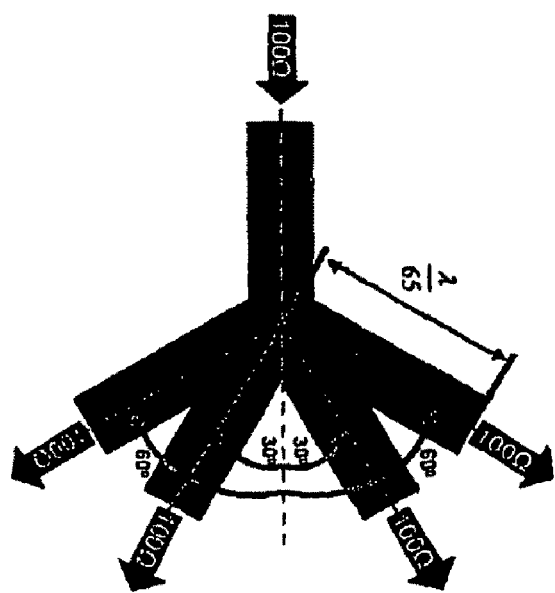
FIG. 44 is a schematic diagram depicting design geometry for an embodiment of a tree-junction.

To simplify the design and fabrication process, all of the MEMS switches are SP4T. Since one signal must be split among four different phased paths, a four-way Y-junction (or tree-junction) was designed. The geometry of the tree-junction used is shown in FIG. 44.

Each of the four output stubs are the same width as those of the other signal lines and are λ/65 long at the design frequency (or 220 μm). This is sufficiently small to prevent RF energy from entering the stubs that are associated with non-activated MEMS switches (that is, in the up state). Using longer lines increases the amount of leakage power into these stubs. Using shorter stubs forces the layout to be too dense. The λ/65 length is optimal for this particular layout. However, a good rule of thumb is to use line lengths less than λ/25 to avoid excessive leakage power. Fine tuning can be done using a full-wave simulator. Each stub is placed at 30° or 60° off the main axis.

Figure 45:
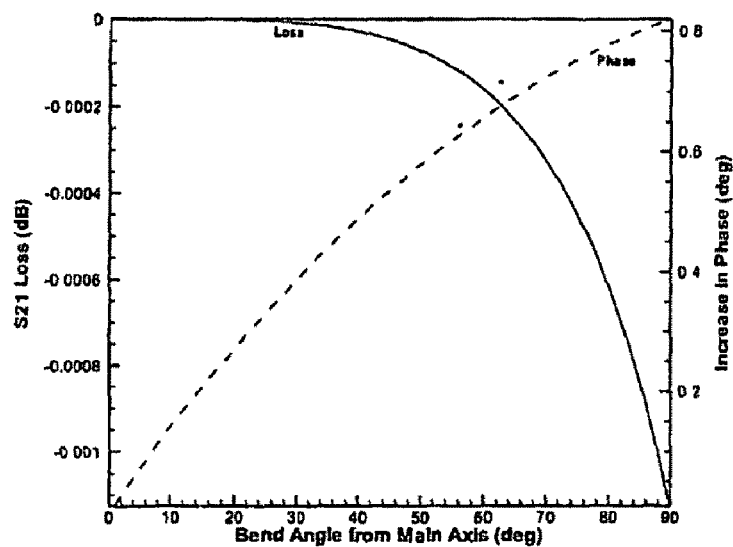
FIG. 45 is a graph depicting S21 loss and phase data for an embodiment of a tree-junction.

These values can vary, but symmetry across the main axis is necessary for symmetric distribution of power. Very wide angles can be used with very short stubs to prevent layout crowding (as in this case). Alternatively, very narrow angles can be used with long stubs to keep the layout small. To demonstrate that the angle can vary without greatly effecting the performance, a full wave simulation was run with one stub that varies the bend angle from 0° to 90°. The results are shown in FIG. 45.

For all angles between 0° to 90°, the effect of the bend is negligible. The additional phase increase from the bend discontinuity is 0.39° and 0.66° for the 30° and 60° bends, respectively. The additional insertion loss was too small to measure. An example of a fabricated tree-junction with MEMS switches on LCP was shown in the cutout of FIG. 37.

Fabricating on a flexible, organic substrate is not as straightforward as using a smooth, flat substrate like silicon. Being a flexible material, it is prone to curling. This effect becomes more pronounced throughout processing due to the fluctuation of temperature from the various baking, deposition and etching steps. The Coefficient of Thermal Expansion (CTE) of LCP is 17 ppm/° C. in the horizontal (x,y) directions and 24 ppm/° C. in the vertical (z) direction. However, the CTE of LCP can be engineered to any value between 0 and 30 ppm/° C.

Since optical lithography with a 3-5 μm resolution can not typically be performed on a curled substrate, it was necessary to mount the sample to a flat, cleanroom grade material before processing. Temporary mounting can be done using a spin-on or roll-on adhesive, for example. Permanent mounting can be done using a thermal bonding technique, for example. Since the substrate is also an organic polymer, surface roughness can be an issue. The surface roughness is usually on the order of 2-5 μm. Given that the MEMS switch is generally suspended 2-3 μm above the substrate, the surface roughness can be large enough to prevent the switch from deflecting. To solve this problem, each sample is mechanically polished using a slurry, in this case an alumina slurry. After polishing, the sample had a surface roughness between 10-50 nm, which is smooth enough for MEMS switch operation.

Figure 46:
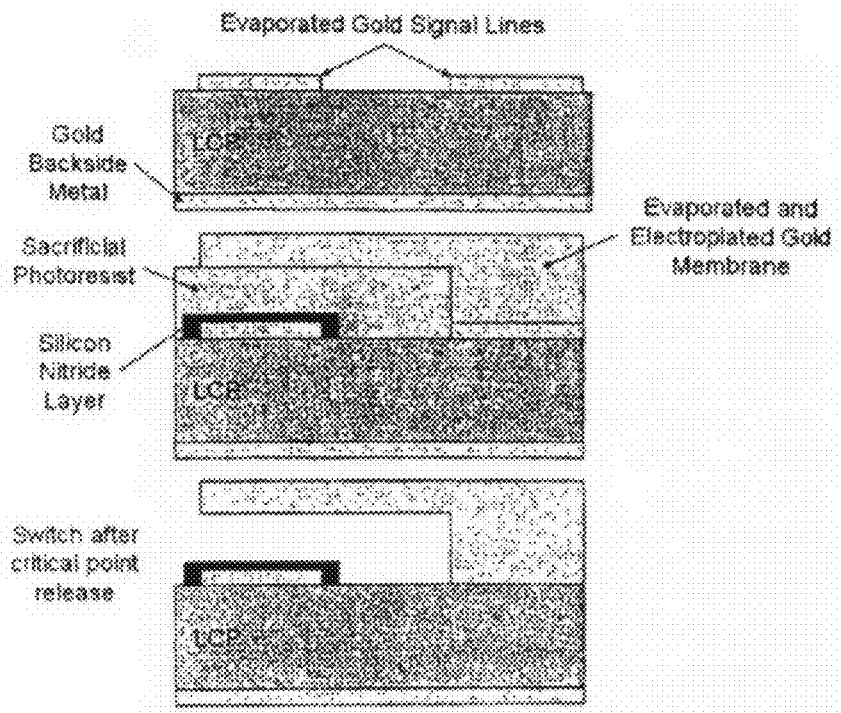
FIG. 46 is a schematic diagram depicting an embodiment of a MEMS switch at selected intervals during a fabrication process.

After polishing and mounting to a flat material, the following procedure (illustrated in FIG. 46) was used in fabricating the MEMS phase shifters. Gold transmission lines were electron beam evaporated and patterned using hard contact optical lithography. A silicon nitride ($Si_3N_4$) layer was deposited using low-temperature Plasma Enhanced Chemical Vapor Deposition (PECVD). The silicon nitride was then patterned and etched using a Reactive Ion Etch (RIE) process everywhere except for the MEMS switch contact areas. Photoresist was patterned to provide a sacrificial layer for the switches.

Gold for the switch membrane was evaporated, patterned, electroplated to 2 μm and etched. The sacrificial layer was stripped away leaving the MEMS switches suspended above the signal lines. The sample was dried using carbon dioxide ($CO_2$) at the supercritical point to prevent switch collapse due to water surface tension. A fabricated MEMS phase shifter is shown in FIG. 37.

LCP is seemingly ideal for thermocompression bonding because it can be manufactured to melt at either 315° C. (high melt LCP) or 290° C. (low melt LCP). For this packaging method embodiment, the low melt LCP is used as the 25 μm thick bond ply and the high melt LCP is used as the substrate and superstrate layers. When the substrate (with MEMS phase shifters), bond ply and superstrate layers are sandwiched together and placed inside a thermocompression bonding machine at a temperature between 290° C. and 315° C., the low melt LCP bond ply will melt and adhere substantially uniformly to the outer core layers. This creates the all-organic, near-hermetic package. Other materials require high voltages or metal rings to adhere the packaging layer. Although a thermocompression bonding machine was used in this embodiment, other devices, such as hot plates or an oven, could be used.

Measurement results were taken using high impedance DC probes to apply the switch bias voltage. Thru-Reflect-Line (TRL) calibration was performed on wafer to remove the connector and cable losses. Calibration was done without the superstrate layer so the effect of the packaging can be measured. The difference in the input impedance with and without the superstrate is only 4Ω, which should not have a substantial effect on the response.

At 14 GHz, the line loss is approximately 0.37 dB/cm for both unpackaged and packaged configurations. The average variation in the line loss between 8 GHz and 20 GHz is 0.00625 dB and the maximum variation is 0.0239 dB. Clearly, the 4 Ω input impedance difference has a negligible effect on the response.

Figure 47:
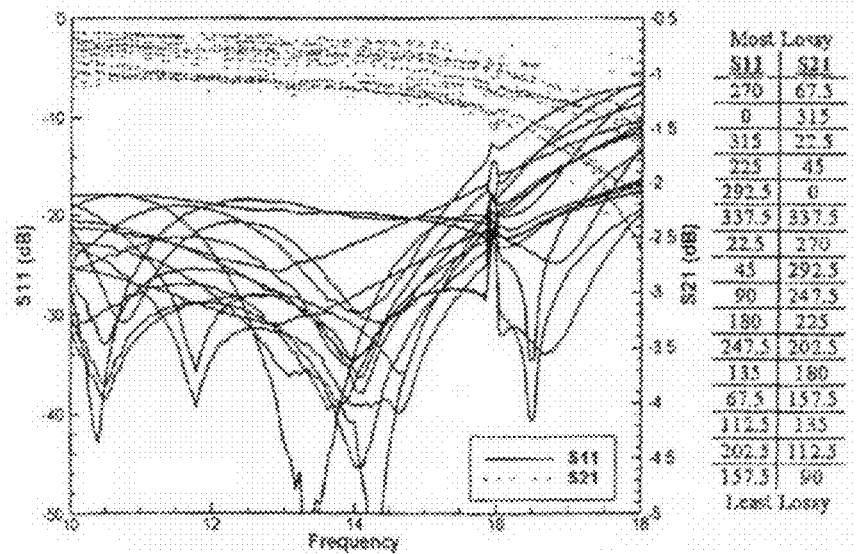
FIG. 47 is a graph depicting measured loss of an embodiment of an unpackaged phase shifter, with the order of the lines being listed from most lossy to least lossy at 14 GHz in the accompanying table.
Figure 48:
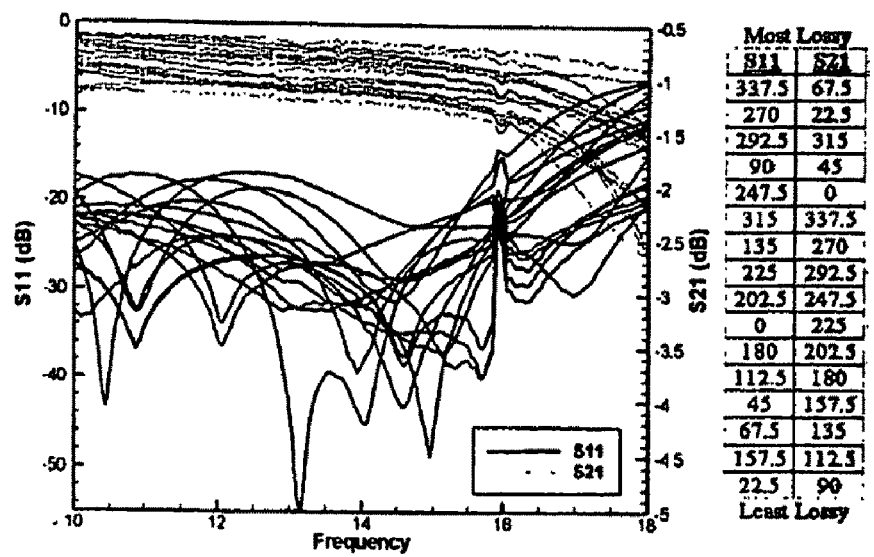
FIG. 48 is a graph depicting measured loss of an embodiment of a packaged phase shifter, with the order of the lines being listed from most lossy to least lossy at 14 GHz in the accompanying table.

The loss measurement results for the four-bit MEMS phase shifter without the top superstrate layer (unpackaged) are shown in FIG. 47. The average S11 is −30.9 dB and the average S21 is −0.95 dB. This is a per-bit loss of only 0.238 dB. The loss measurement results with the top superstrate layer (packaged) are shown in FIG. 48. The average S11 is −32.5 dB and the average S21 is −0.96 dB. This is a per-bit loss of only 0.240 dB.

Figure 49:
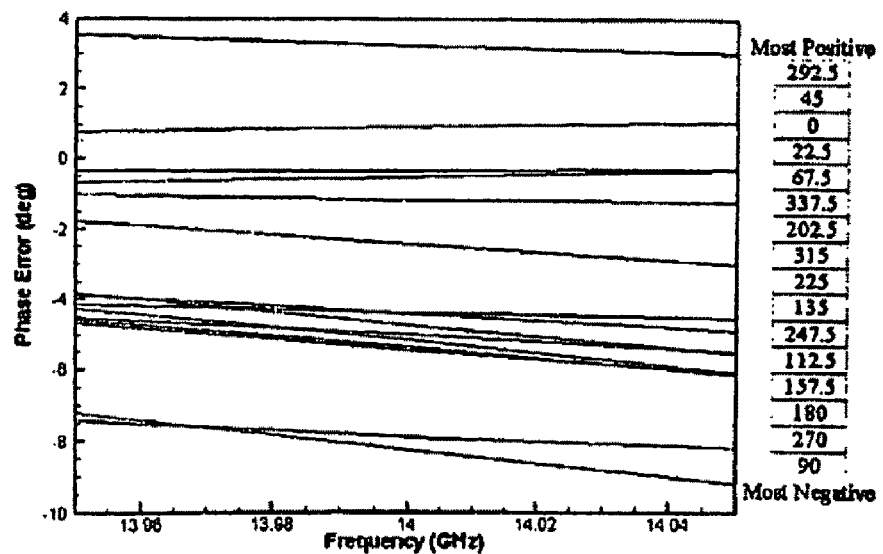
FIG. 49 is a graph depicting measured phase error of an embodiment of an unpackaged phase shifter.
Figure 50:
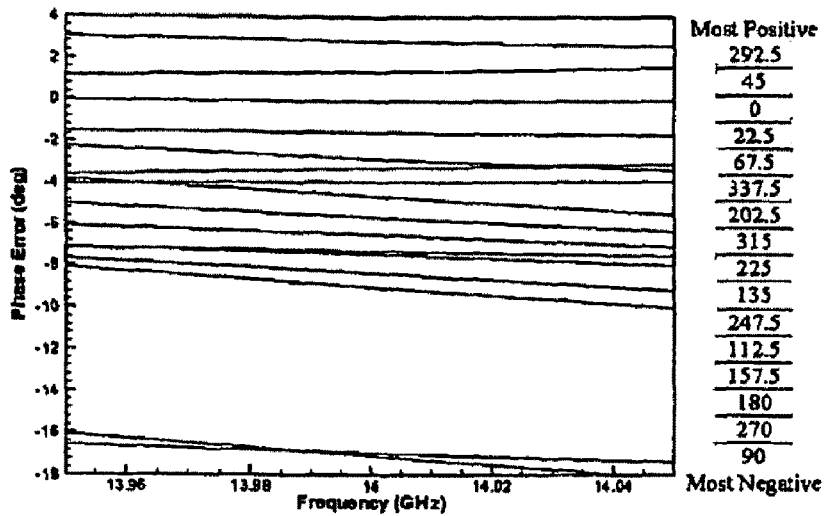
FIG. 50 is a graph depicting measured phase error of an embodiment of a packaged phase shifter, with the order of the lines being listed from most positive to most negative at 14 GHz in the accompanying table.

The phase error measurement results without the top superstrate layer (unpackaged) are shown in FIG. 49. The average phase error is 3.96 degrees. The phase error measurement results with the top superstrate layer (packaged) are shown in FIG. 50. The average phase error is 6.57 degrees.

Figure 51:
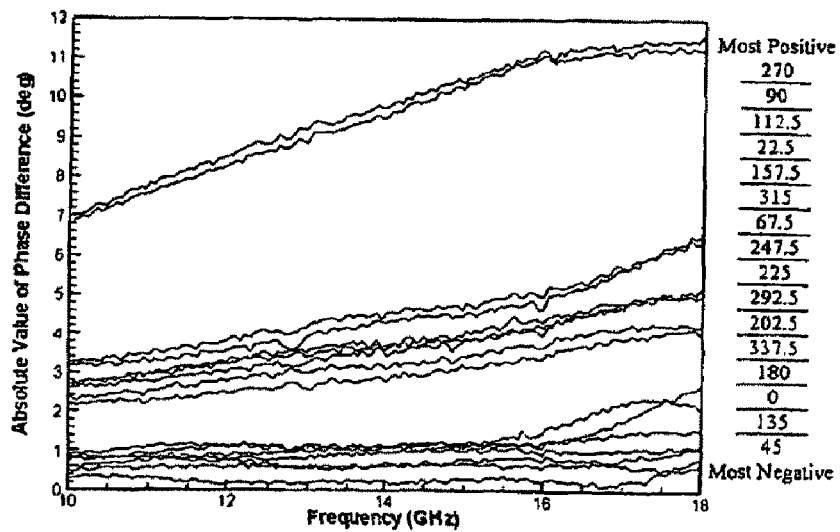
FIG. 51 is a graph depicting the difference between unpackaged and packaged S21 phase, with the order of the lines being listed from most positive to most negative at 14 GHz in the accompanying table.

In order for this to be a suitable packaging technique, there should be minimal variation in the loss and phase response with and without the superstrate layer. Fortunately, this variation is minor, as shown in the figures. The average S21 loss variation is only 0.013 dB, which is practically negligible. The variation in the phase is shown in FIG. 51. The average variation is only 3.16 degrees.

Figure 52:
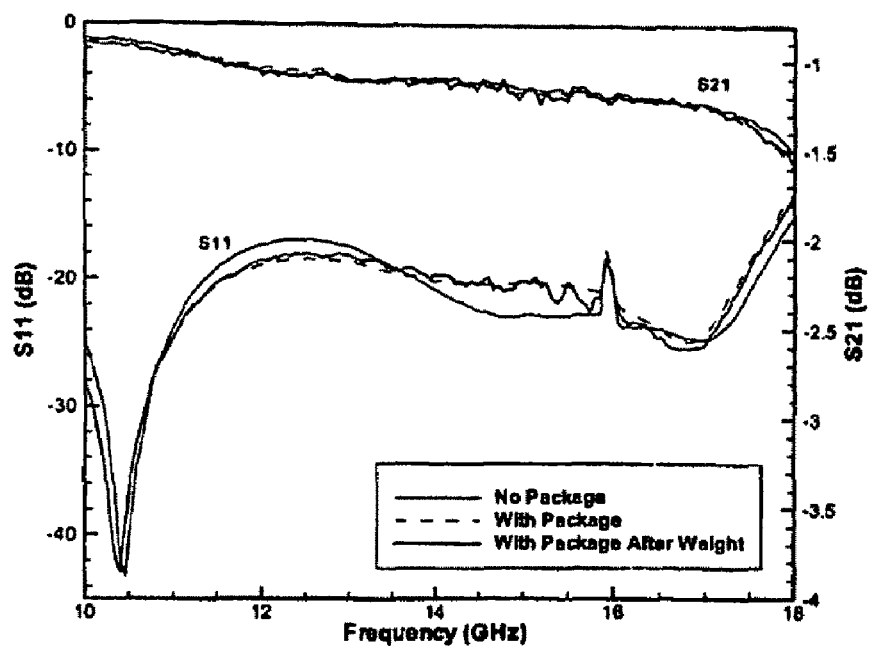
FIG. 52 is a graph depicting loss measurement of the embodiment of the phase shifter for the 0° case without a package, with a package, and with a package after applying 15 psi of force.
Figure 53:
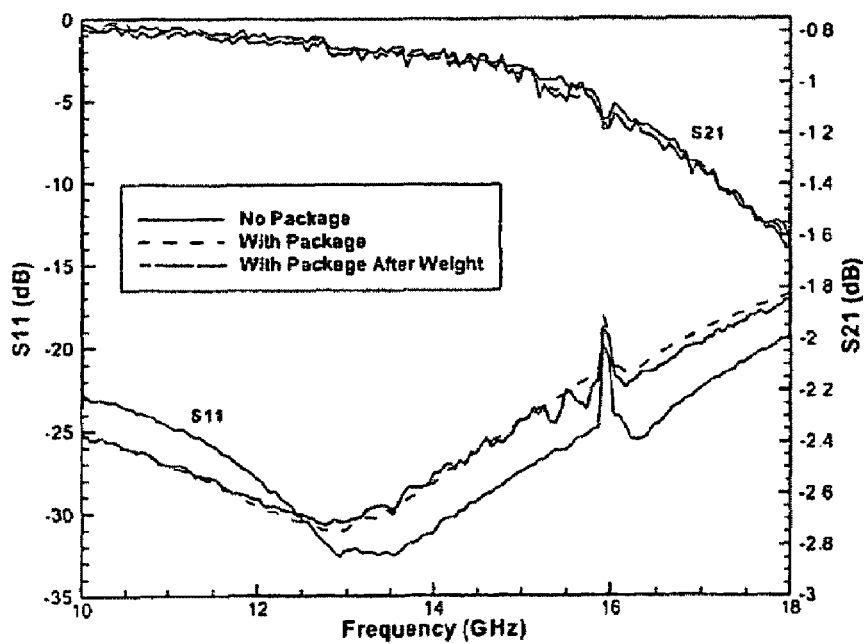
FIG. 53 is a graph depicting loss measurement of the embodiment of the phase shifter for the 337.5° case without a package, with a package, and with a package after applying 15 psi of force.
Figure 54:
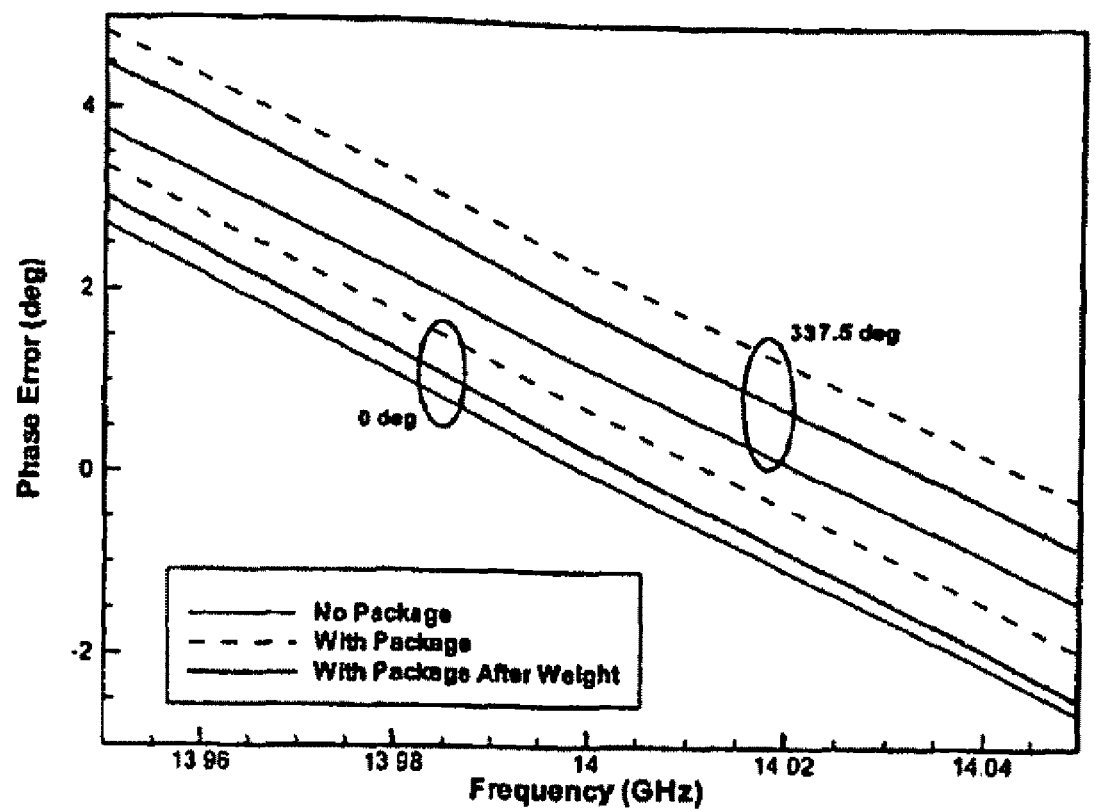
FIG. 54 is a graph depicting phase error measurement of the embodiment of the phase shifter for the 0° and 337.5° cases without a package, with a package, and with a package after applying 15 psi of force.

To demonstrate the mechanical strength of the package, a 15 pound per square inch (psi) force was applied to the top of the package. This test was conducted to show that the package can withstand the pressure necessary for thermocompression bonding and once bonded can withstand being compressed. A loss and phase comparison of the phase shifter without the package, with the package, and with the package after being subjected to the weight is shown in FIG. 52. For brevity, only the shortest (0°) and longest) (337.5° phased paths are shown.

The addition of the weight creates compressive stresses in the LCP around the cavity discontinuities. These stresses extend to the signal line metal which causes small deflections in the MEMS switches. Any changes in the MEMS switch geometry will change the switch capacitance, which accounts for the very small variation on the loss and phase. Increasing the size or rounding the shape of the cavities would decrease the compressive stresses in the LCP. This would decrease the effect of the weight or would allow for more weight to be applied.

As expected, adding the superstrate layer to package the phase shifter had a minimal effect on the performance. The best case, worst case, and average results are summarized in Table I.

TABLE 1

|  | Worst Case | Average | Best Case |
| --- | --- | --- | --- |
| Unpackaged S11 | −20.8 dB | −30.9 dB | −45.0 dB |
| Unpackaged S21 | −1.22 dB | −0.95 dB | −0.66 dB |
| Packaged S11 | −19.7 dB | −32.5 dB | −45.3 dB |
| Packaged S21 | −1.21 dB | −0.96 dB | −0.69 dB |
| Unpackaged Phase Error | 8.25° | 3.96° | 0.34° |
| Packaged Phase Error | 17.07° | 6.57° | 1.38° |
| S21 Loss Variation | 0.045 dB | 0.013 dB | 0.0022 dB |
| S21 Phase Variation | 9.77° | 3.16° | 0.27° |

For the first time, RF MEMS phase shifters have been packaged on a flexible, organic substrate; specifically, Liquid Crystal Polymer. In addition, this is the first time that a small size four-bit phase shifter was published on an organic material. Several modifications were made to the traditional microstrip switched-line phase shifter layout to reduce the size and improve the performance. Measurement results exemplify the low-loss nature of this polymer at high frequencies. With an average return loss higher than 30 dB and an average insertion loss lower than 0.96 dB (0.24 dB/bit), this is the first organic, packaged, miniature phase shifter with minimal loss.

The foregoing description has been presented for purposes of illustration and description. It is not intended to be exhaustive or to limit the invention to the precise forms disclosed. Modifications or variations are possible in light of the above teachings.

The invention claimed is:

1. A multilayer electronic component system comprising:
a first layer of liquid crystal polymer (LCP) exhibiting a first melting temperature;
first electronic components supported by the first layer; and
a second layer of LCP exhibiting a second melting temperature lower than the first melting temperature;
wherein the first layer is attached to the second layer by thermal bonds associated with melted material of the second layer of LCP contacting solid material of the first layer of LCP; and
wherein at least a portion of the first electronic components are located between the first layer and the second layer.

2. The system of claim 1, further comprising a third layer of LCP located such that the second layer is positioned between the first layer and the third layer, the second layer being thermally bonded to the first layer and the third layer.

3. The system of claim 2, further comprising second electronic components supported by the third layer.

4. The system of claim 3, wherein the first electronic components comprise a first antenna array and the second electronic components comprise a second antenna array.

5. The system of claim 4, wherein the first antenna array and the second antenna array operate at different frequencies and the system further exhibits dual polarization.

6. The system of claim 4, wherein polarization directions of each of the first antenna array and the second antenna is 45° and 135°.

7. The system of claim 4, wherein each of the first antenna array and the second antenna array operates at GHz frequencies.

8. The system of claim 7, wherein the first antenna array operates at approximately 14 GHz and the second antenna array operates at approximately 35 GHz.

9. The system of claim 4, further comprising means for shifting a phase of a signal of the first antenna array.

10. The system of claim 4, further comprising a phase shifter electrically interconnected with the first antenna array and operative to shift a phase of a signal of the first antenna array.

11. The system of claim 10, wherein the phase shifter comprises a microelectromechanical system (MEMS) switch.

12. The system of claim 2, wherein the first layer and the third layer exhibit higher melting temperatures than a melting temperature of the second layer.

13. The system of claim 12, wherein the first layer, the second layer and the third layer exhibit substantially similar coefficients of thermal expansion such that mechanical stresses between the layers are reduced.

14. A multilayer electronic component system comprising:
a first layer of liquid crystal polymer (LCP);
a first antenna array supported by the first layer;
a second layer of LCP fixed with respect to the first layer;
a second antenna array supported by the second layer; and
a third layer of LCP located and thermally bonded between the first layer and the second layer by melted material of the third layer, the first layer and the second layer exhibiting higher melting temperatures than a melting temperature of the third layer;
wherein the first antenna array and the second antenna array operate at different GHz frequencies.

15. The system of claim 14, wherein the first antenna array has polarization directions of 45° and 135°.

16. The system of claim 15, wherein the first antenna array has a symmetrical feed network with respect to each of the polarization directions.

17. A method for manufacturing a multilayer electronic component system comprising:
providing a first layer of liquid crystal polymer (LCP) exhibiting a first melting temperature;
supporting first electronic components with the first layer;
providing a second layer of LCP exhibiting a second melting temperature lower than the first melting temperature;
exposing the first layer and the second layer to a temperature at least as high as the second melting temperature but below the first melting temperature to melt at least a portion of the second layer; and
using melted material of the second layer to thermally bond the second layer of LCP to the first layer such that the first electronic components are located between at least a portion of the first layer and at least a portion of the second layer.

18. The method of claim 17, wherein the method further comprises:
providing a third layer of LCP; and
orienting the third layer such that the second layer is positioned between the first layer and the third layer; and
wherein the exposing further comprises exposing the first layer, the second layer and the third layer to a temperature at least as high as the second melting temperature but below the first melting temperature to melt at least a portion of the second layer such that melted material of the second layer thermally bonds the third layer bonds to the second layer.

19. The method of claim 18, wherein a melting temperature of the second layer is lower than melting temperatures of the first layer and the third layer.

* * * * *